United States Patent [19]
Glavish et al.

[11] Patent Number: 5,481,116
[45] Date of Patent: Jan. 2, 1996

[54] MAGNETIC SYSTEM AND METHOD FOR UNIFORMLY SCANNING HEAVY ION BEAMS

[75] Inventors: Hilton F. Glavish, Incline Village, Nev.; Michael A. Guerra, deceased, late of Exeter, N.H., by Sarah B. Cutler, executor

[73] Assignee: IBIS Technology Corporation, Danvers, Mass.

[21] Appl. No.: 259,919

[22] Filed: Jun. 10, 1994

[51] Int. Cl.$^6$ .................................................. H01J 37/147
[52] U.S. Cl. ........................... 250/396 ML; 250/492.21; 335/210; 335/213
[58] Field of Search ........................... 250/396 ML, 398, 250/396 R, 492.21, 492.3; 335/210, 213

[56] References Cited

U.S. PATENT DOCUMENTS

| | | |
|---|---|---|
| 2,053,537 | 9/1936 | Schlesinger . |
| 2,108,091 | 2/1938 | Von Ardenne . |
| 2,260,725 | 10/1941 | Richards et al. . |
| 3,193,717 | 7/1965 | Nunan . |
| 3,569,757 | 3/1971 | Brewer et al. . |
| 3,911,321 | 10/1975 | Wardly ..................................... 315/364 |
| 4,063,098 | 12/1977 | Enge . |
| 4,260,897 | 4/1981 | Bakker et al. . |
| 4,276,477 | 6/1981 | Enge . |
| 4,367,411 | 1/1983 | Hanley et al. ........................ 250/492.2 |
| 4,469,948 | 9/1984 | Veneklasen et al. . |
| 4,687,936 | 8/1987 | McIntyre et al. . |
| 4,745,281 | 5/1988 | Enge . |
| 4,804,852 | 2/1989 | Rose et al. . |
| 4,806,766 | 2/1989 | Chisholm ........................ 250/396 ML |
| 5,012,104 | 4/1991 | Young . |
| 5,053,627 | 10/1991 | Ruffell et al. . |
| 5,132,544 | 7/1992 | Glavish . |
| 5,311,028 | 5/1994 | Glavish . |

FOREIGN PATENT DOCUMENTS 62-88246 4/1987 Japan .

OTHER PUBLICATIONS

H. F. Glavish et al., "Fast Magnetic Scanning and Ion Optical Features of the New Ibis Oxygen Implanter," Nucl. Instr. & Methods, vol. B74, pp. 397–400 (1993).

Primary Examiner—Jack I. Berman
Assistant Examiner—Kiet T. Nguyen
Attorney, Agent, or Firm—Fish & Richardson

[57] ABSTRACT

A magnetic system for uniformly scanning an ion beam comprising a magnetic structure having poles with associated scanning coils and respective pole faces that define therebetween a gap through which the ion beam passes; and a magnetic circuit for producing in the gap a magnetic field of sufficient magnitude to prevent the occurrence of a recently observed plasma effect in which the transverse cross-section of the ion beam substantially fluctuates in size while the ion beam is being scanned across the selected surface.

37 Claims, 17 Drawing Sheets

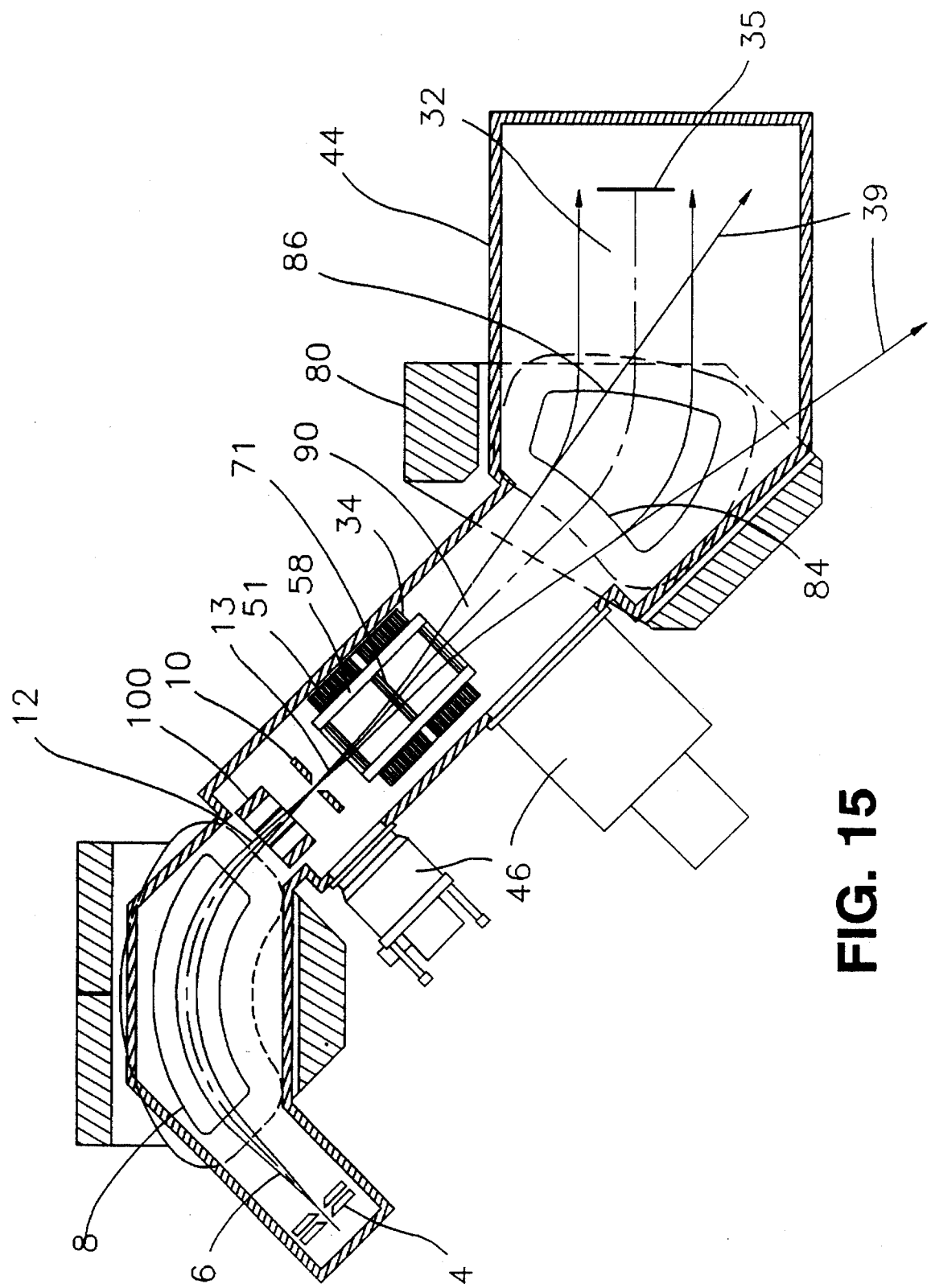

MAGNETIC SYSTEM AND METHOD FOR UNIFORMLY SCANNING HEAVY ION BEAMS

FIELD OF THE INVENTION

This invention relates to magnetic systems such as ion implanters that scan heavy ion beams of atoms and molecules of the elements.

BACKGROUND OF THE INVENTION

There are many industrial and scientific applications that require surfaces to be uniformly irradiated by ion beams. For example, modification of semiconductors such as silicon wafers is often implemented by ion implanters, in which a surface is uniformly irradiated by a beam of ions or molecules of a specific species and energy. Because the physical size of the wafer or substrate (e.g., about 5 inches in diameter or more) is larger than the cross-sectional area of the irradiating beam (e.g., about 2 inches in diameter or less), the required uniform irradiance is commonly achieved by scanning the beam across the wafer or scanning the wafer through the beam, or a combination of these techniques.

It is distinctly advantageous to have a high beam scan rate over the substrate for a number of reasons: the irradiance uniformity is more immune to changes in the ion beam flux; a higher wafer throughput is possible at low dose levels; and for high dose applications degradation from local surface charging, thermal pulsing, and local particle-induced phenomena such as sputtering and radiation damage are greatly reduced.

Scanning techniques based only upon reciprocating mechanical motion are very limited in speed. Motion of the wafer on an arc through the beam greatly improves the scan speed but requires many wafers or substrates to be simultaneously mounted on a rotating carousel in order to obtain efficient utilization of the beam.

In a common variation, a time varying electric field is used to scan the beam back and forth in one direction, while the wafer is reciprocated in another direction. In this hybrid-type of implanter the beam current and hence rate at which wafers can be processed is severely limited by the space-charge forces which act in the region of the time-varying electric deflection fields. These forces cause the ions in the beam to diverge outward, producing an unmanageably large beam envelope. Such a space-charge limitation also occurs in implanters that use time-varying electric fields to scan the beam in two directions.

Space-charge blow-up is the rate at which the transverse velocity of a beam increases with distance along the beam axis. This is proportional to a mass normalized beam perveance $$\xi = I\, M^{1/2} E^{-3/2} \tag{1}$$

where I is the beam current, M is the ion mass, and E is the ion energy. (*The Physics and Technology of Ion Sources*, Ed. Ian G. Brown, John Wiley & Sons, New York 1989). For typical ion beam configurations encountered in ion beam implanters, space-charge effects become limiting at a perveance of $\xi \cong 0.02 [mA][amu]^{1/2}[keV]^{-3/2}$. Thus, an 80 keV arsenic beam becomes space-charge limited at $\cong 1.7$ mA, while a 5 keV beam is space-charge limited at just $\cong 0.03$ mA. Therefore, scanning an ion beam with an oscillatory electric field is not viable for an efficient commercial ion implanter in which the beam current is preferably greater than a few milliamperes, even at energies as low as 10 keV.

A scanning magnet that produces a high frequency time-varying magnetic field for scanning ion beams in implanters is described by one of the inventors in U.S. Pat. No. 5,311,028, in which a scanning magnet that has a yoke formed from laminations of high magnetic permeability separated by relatively thin electrically insulating material can be used to scan high perveance, heavy ion beams at frequencies up to 1,000 Hz.

SUMMARY OF THE INVENTION

The present invention addresses unexpected plasma conditions that can occur in magnetic ion beam scanning and provides techniques to enhance the radiation uniformity, accuracy and repeatability of ion beam scanning. It has been observed that an unexpected plasma effect occurs within an ion beam in, e.g., an ion implanter that uses magnetic scanning of the beam. This effect appears as a sudden change in the beam emittance (i.e., the area occupied by all of the ions when displayed on a plot of ion angle versus position) when the scanning magnetic field used to scan the ion beam passes through or approaches zero.

A magnetic system has been invented for uniformly scanning ion beams that substantially eliminates or compensates for the above-observed effect comprising: a magnetic structure having poles with associated scanning coils and respective pole faces that define therebetween a gap through which the ion beam passes; a primary current source coupled to the scanning coils adapted to apply to the scanning coils an excitation current to generate a primary magnetic field in the gap that alternates in polarity as a function of time to cause scanning of the ion beam; secondary coils disposed adjacent the gap to produce a secondary magnetic field in the gap, the secondary coils being substantially free from inductive coupling with the scanning coils; and a secondary current source coupled to the secondary coils adapted to apply to the secondary coils a current that generates the secondary magnetic field in the gap, the superimposed primary and secondary magnetic fields in the gap having a sufficient resultant magnitude to prevent the transverse cross-section of the ion beam from substantially fluctuating in size while the ion beam is being scanned across the selected surface.

An induced electric field, associated with the time-varying magnetic scanning field, inductively accelerates or decelerates neutralizing electrons in the ion beam depending upon the relative change of the magnitude of the scanning magnetic field. As the magnetic scanning field decreases to a small magnitude, the neutralizing electrons within the beam expand over an area that is comparable or greater than the beam cross-section. Whereas, as the magnetic scanning field increases in magnitude to greater than, e.g., about 50 Gauss, the neutralizing electrons are compressed into an area that is typically less than the cross-sectional area of the beam. The inventors believe that the rapid redistribution of electron density resulting from the above-mentioned induced electric fields generates a plasma effect that causes the emittance of the ion beam to fluctuate in the manner observed.

The novel scanning system according to the invention provides a magnetic circuit that maintains the magnitude of the magnetic fields in the gap at a sufficient level to prevent the transverse cross-section of the ion beam from fluctuating in size while the ion beam is being scanned across the selected surface. Furthermore, because a secondary magnetic circuit, which is independent of the primary scanning magnetic circuit, is employed to provide the necessary compensating magnetic field, the power supplies and corresponding accessories of the primary and secondary magnetic circuits can be separately optimized with respect to cost and efficiency considerations. For example, since the secondary coils are arranged so that they do not inductively couple with the primary scanning coils, the secondary coils can be energized with a simple dc power supply, as opposed to a high power, high frequency supply.

Thus, the inventors have discovered a magnetic system for uniformly scanning ion beams that substantially minimizes changes or fluctuations in the beam size, and that enables repetitive scanning at high rates, high accuracy and improved repeatability.

Preferred embodiments of the invention includes one or more of the following features.

The secondary current source is preferably a dc current source. The superimposed magnitude of the primary and secondary magnetic fields is preferably greater than about 50 Gauss. The secondary coils preferably lie in a plane that is substantially parallel to the alternating directions of the primary magnetic field in the gap. In certain preferred embodiments, at least one sector magnet is disposed in the path of the ion beam and adapted to deflect the ion beam in a direction toward the selected surface in a manner enabling separation of neutral particles from the ion beam before the neutral particles impinge upon the selected surface. In certain embodiments, the primary and secondary coils are adapted to cause the ion beam to scan across an angular region in a plane substantially orthogonal to the selected surface. In certain other embodiments, the wafers are oriented at a preselected angle with respect to the scanning plane.

Preferably, the magnetic structure comprises, at least in part, a plurality of laminations of high magnetic permeability material each of which has a thickness in the range between about 0.2 and 1 millimeter, the laminations being separated by relatively thin electrically insulating layers, and the laminations providing a low reluctance magnetically permeable path for the primary magnetic field, the laminations serving to confine induced eddy currents to limited values in local paths in respective laminations, thereby enabling the desired deflection of the ion beam. Preferred embodiments also include a source of an ion beam to introduce the ion beam into the gap defined by the pole faces.

In certain embodiments the magnetic structure comprises ferrite material. Preferably, a liner is disposed between the ferrite material and the ion beam to shield the ferrite material from the ion beam. Preferably, the liner consists of silicon.

In certain preferred embodiments, a velocity separator is disposed in the path of the ion beam for removing singly-charged ions from the ion beam before the ion beam irradiates the selected surface so that higher final ion energies can be obtained from the multiply-charged ions remaining in the beam. Preferably, the deflection system includes a magnetic circuit adapted to apply to the gap a magnetic field that varies as a function of time to cause scanning of the ion beam at a rate of at least 20 Hz.

Preferred embodiments include a dc sector magnet positioned to receive the ion beam after the beam passes through the gap and constructed and arranged to apply to the ion beam a substantially constant magnetic field that deflects said ion beam in the scanning plane so that the beam follows a beam path that makes an angle with the beam path through the scanner gap that is substantially greater than zero, whereby a substantial proportion of neutral particles that may exist in the ion beam are removed from the beam before the beam irradiates the selected surface. Preferably the dc sector magnetic includes contours shaped according to polynomials of greater than second order, and more preferably of fourth order.

In one important aspect, the invention features secondary coils that form at least two adjacent loops. In preferred embodiments, the respective areas enclosed by the loops are substantially equal. In certain preferred embodiments according to this aspect, a magnetic field clamp is disposed proximal to the gap and adapted to cause the magnitude of the primary magnetic field to substantially vanish in the region of the gap between the opposite direction secondary magnetic fields. In certain other preferred embodiments according to this aspect, the secondary coils are further adapted to generate across the gap an additional magnetic field, wherein as the ion beam passes through the gap it passes through at least three regions in which the magnetic field in one of the regions is of opposite direction as the magnetic field in an adjacent one of the regions. Preferably, each of the secondary coils forms at least three loops that substantially lie in the same plane, wherein the areas enclosed by the loops is selected so that the net coupling between the secondary coils and the primary magnetic field is substantially zero.

In certain preferred embodiments according to this aspect, the secondary coils are arranged in planes substantially parallel to the respective pole faces. Whereas, in certain alternative embodiments, the secondary coils are arranged in planes substantially orthogonal to the respective pole faces.

For those embodiments according to this aspect in which the planes of the secondary coils are not orthogonal to the pole faces, the magnitude of the secondary magnetic fields are preferably 50 Gauss greater than the maximum value of the component of the time-varying primary magnetic field normal to the plane of the secondary coils.

In another important aspect, the invention features a magnetic deflection system for scanning an ion beam over a selected surface comprising: a magnetic structure having poles with associated scanning coils and respective pole faces that define therebetween at least a pair of gaps through which the ion beam passes; a primary current source coupled to the scanning coils adapted to apply to the scanning coils an excitation current to generate respective primary magnetic fields in the pair of gaps that alternate in polarity as a function of time to cause scanning of the ion beam; a field clamp disposed in an intermediate region located between the gaps and adapted to cause the magnitude of the primary magnetic field to substantially vanish in the intermediate region; secondary coils disposed adjacent the pair of gaps to produce secondary magnetic fields in the pair of gaps, the secondary coils being substantially free from inductive coupling with the scanning coils; and a secondary current source coupled to the secondary coils adapted to apply to the secondary coils currents that generate respective secondary magnetic fields in the pair of gaps, the respective secondary magnetic fields being substantially of opposite direction, the superimposed primary and secondary magnetic fields in the pair of gaps having a sufficient resultant magnitude to prevent the transverse cross-section of the ion beam from substantially fluctuating in size while the ion beam is being scanned across the selected surface.

In another general aspect, the invention features a magnetic deflection system for scanning an ion beam over a selected surface comprising: a magnetic structure having poles with associated scanning coils and respective pole faces that define therebetween a gap through which the ion beam passes; waveform generating means for energizing the scanning coils to generate a primary magnetic field in the gap to cause scanning of the ion beam; and beam controlling means disposed adjacent of the gap to produce a magnetic field in the gap that prevents the transverse cross-section of the ion beam at the selected surface from substantially fluctuating in size while the ion beam is scanning over the selected surface, the beam controlling means being substantially free from inductive coupling with the scanning coils.

The invention also features an ion implantation system comprising a magnetic deflection system for scanning an ion beam over a selected surface in combination with an ion source for a selected species of ions, an end station arranged to position a semiconductor substrate having a selected surface for receiving the ion beam, and a vacuum housing extending from the ion source, about the magnetic system to the end station, whereby the beam is exposed directly to the pole faces of the deflection system as the beam travels under vacuum from the ion source to the end station; the magnetic deflection system being constructed and arranged to scan the beam of heavy ions uniformly across the substrate at the end station to effect ion implantation in the substrate.

In another aspect, the invention features a method for scanning an ion beam over a selected surface comprising the steps of: providing a magnetic structure having poles with associated scanning coils and respective pole faces that define a gap therebetween; passing an ion beam through the gap; generating on energizing waveform in the scanning coils to generate a primary magnetic field in the gap to cause scanning of the ion beam; and providing a magnetic field generator that is substantially uncoupled to the scanning coils for magnetically preventing the transverse cross-section of the ion beam at the selected surface from substantially fluctuating in size while the ion beam is scanning over the selected surface.

Other features and advantages of the invention will become apparent from the following description and from the claims.

BRIEF DESCRIPTION OF THE DRAWINGS

FIG. 15 is another schematic diagram of an alternative ion beam system utilizing magnetic scanning according to the invention in conjunction with a sector magnet collimator.

DESCRIPTION OF THE PREFERRED EMBODIMENTS

Figure 1:
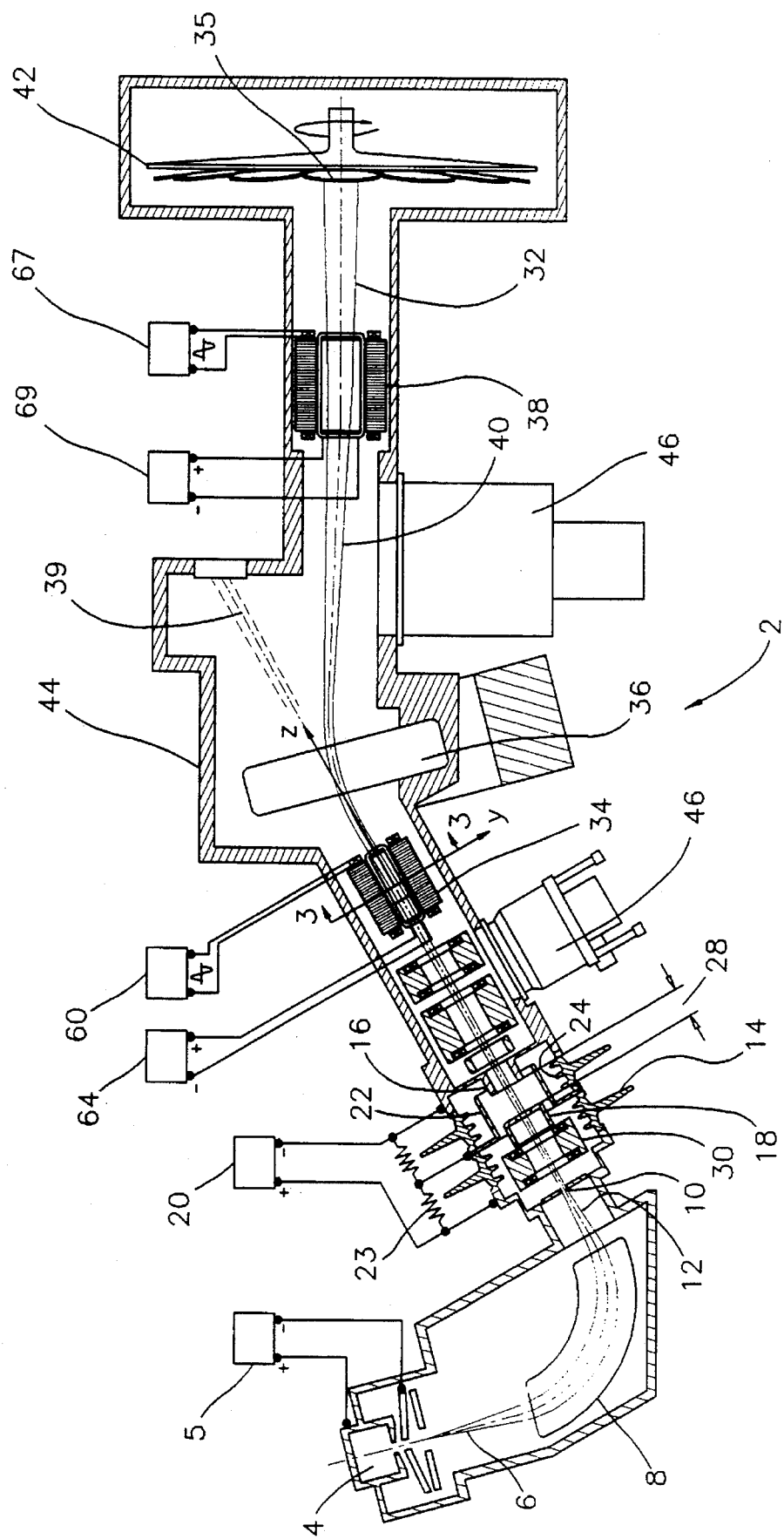
FIG. 1 is a schematic diagram of a preferred ion beam system including a scanner magnet that is acting on an ion beam to irradiate the surface of wafers mounted on a rotatable carousel.
Figure 2:
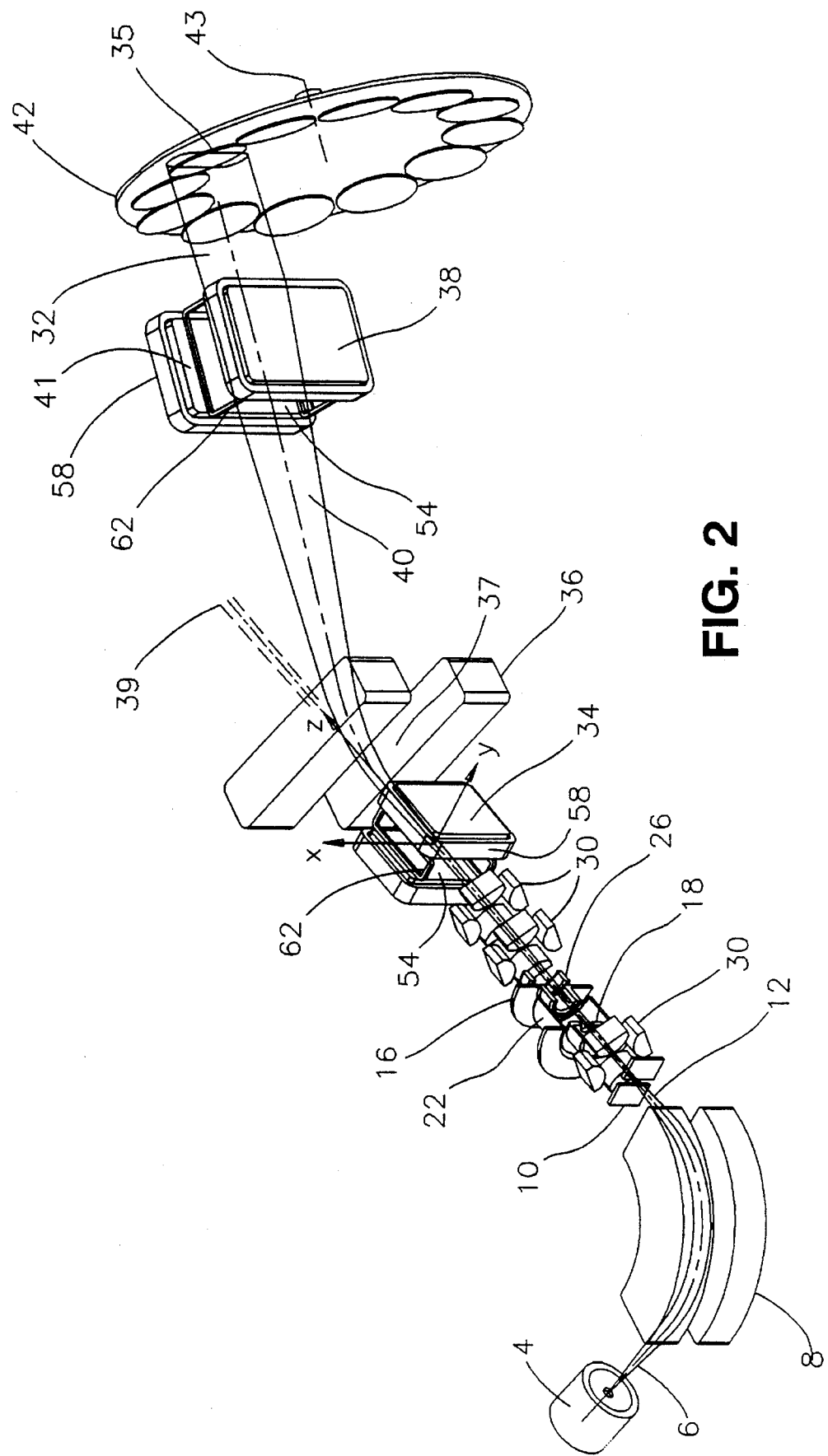
FIG. 2 is a perspective view of the ion beam system shown in FIG. 1.

Referring to FIGS. 1 and 2, an ion implanter 2 includes a scanner magnet 34 and a collimator magnet 38 which are employed to transport and scan a high perveance, heavy ion beam in a manner in accordance with the present invention. Scanning coils 58 in scanner 34 generate a primary oscillatory magnetic field that deflects the ion beam over time in a scan direction (i.e., the x direction shown in FIG. 2), thereby causing the beam to oscillate in a fan-shaped region 40 in a scanning plane parallel to the x-axis of FIG. 2. A wafer 35 is mounted on a carousel 42 and passes through the ion beam on an arc in a direction more or less orthogonal to the scan direction of the beam, as the carousel rotates about an axis 43. By using a high magnetic scanning frequency, preferably at least 20 Hz, and more preferably 100 to 500 Hz, relative to the rotation frequency of the carousel (e.g., a few revolution per second), much of the wafer surface is irradiated in just one pass of the wafer through the beam, which corresponds to a single revolution of the carousel.

The collimator 38 includes coils that are energized with a suitable electrical waveform to generate an oscillatory magnetic field that is synchronized with the primary magnetic field produced in the scanner and that is adjusted in amplitude to scan ion beam 32 so that the beam impinges on the wafer 35 along a constant preselected direction, irrespective of the position of the beam on the wafer, thus avoiding problems associated with a varying angle of incidence of the beam against the wafer surface. By setting and controlling the oscillatory energizing waveforms in the scanner and collimator to produce a prescribed beam scanning speed across the wafer, a uniform irradiance over the entire surface of the wafer is achieved after just a few rotations of the carousel.

According to an important aspect of the invention, secondary coils 62 are positioned in the scanner and the collimator to produce a secondary magnetic field in the gap so that the superimposed magnitude of the primary and secondary magnetic fields is sufficient to prevent the transverse cross-section of the ion beam from substantially fluctuating in size while the ion beam is being scanned over the wafer. Such a magnetic deflection scheme substantially improves the uniformity of irradiance across the wafer surface.

Heavy ions, such as those derived from the elements of boron, nitrogen, oxygen, phosphorus, arsenic, or antimony, are generated and formed into a beam 6 by an ion source 4 (see e.g., *The Physics and Technology of Ion Sources*, Ed. Ian G. Brown, John Wiley & Sons, New York 1989). The ion source produces very high perveance ion beams as defined in Eq. 1, and an adjustable voltage power supply 5 is used to accelerate the ion beam to an adjustable energy up to about 80 keV per charge state. Electrons generated by the emerging ion beam 6 become trapped or confined within the ion beam. Thus, the ion beam becomes nearly electrically neutral in the absence of external electric fields and insulating surfaces. Under such conditions, the ion beams can be transported in the regions of high vacuum in the ion implanter 2, without exhibiting beam divergence from the action of repelling space-charge forces.

Atomic or molecular species in the ion beam are purified by the cooperative action of a sector magnet 8 and a resolving slit 10, according to the ratio of ion momentum to electric charge (i.e., Mv/q, where v is the ion velocity, q is the ion electric charge, and M is the ion mass as previously defined in Eq. 1). The ion species may be positively or negatively charged, the former being more readily produced in copious quantities with typical ion sources. The sector magnet 8 has pole caps with shape and form suitable to focus the ion beam 12 emerging from the magnet to a more or less ribbon-shaped beam in which the narrow dimension corresponds to the width of resolving slit 10 (see, e.g., H. A. Enge, "Deflecting Magnets," published in *Focusing of Charged Particles*, vol. III, Ed. A. Septier, Academic Press, New York 1967).

In many applications, a post-accelerator 14 is needed to obtain the final required energy. Commonly, this is achieved electrostatically by creating a potential difference along the ion beam path between first and last electrodes 18, 16, respectively, using a high voltage power supply 20 of appropriate polarity to cause the electric field between the first and last electrodes to accelerate the heavy ions toward the last electrode. Deceleration can also be achieved by reversing the polarity of the power supply 20. In practice, an additional intermediate electrode 22 is set at a prescribed potential by an individual power supply, or by a bleed resistor chain 23 between the terminals of power supply 20, to shield the insulating surface 24 of the post-accelerator from the high perveance heavy ion beam. Alternatively, the intermediate electrode can be used to enhance the overall voltage that can be applied to the beam, to provide adjustable focusing of the ion beam, or to provide a combination of these features. The distance 28 between the first and second electrodes is also typically varied to optimize the focusing of the ion beam. A suppressor electrode 26 (FIG. 2) is fitted at the negative end of the post-accelerator to prevent neutralizing electrons from becoming drained out of the beam which would tend to cause the beam to diverge as a result of spaced-charge effects.

Alternative post-acceleration techniques are available, including radio-frequency acceleration (see, e.g., H. F. Glavish, "Radio-frequency linear accelerators for ion implanters," *Nucl. Instr. & Methods*, vol. B21 1987, pp. 218–23).

Magnetic quadrupoles 30 are used before and after the post-accelerator to provide additional focusing to thereby control of the physical size and the angular spread, or emittance, of ion beam 32 at the wafer surface. Since the quadrupole magnetic fields are static, and since electric fields are absent, a high perveance heavy ion beam can be transmitted through the quadrupoles and can be focused or de-focused by the action of the Lorentz force $$F = qv \times B \quad (2)$$

without additional changes occurring in the beam size as a result of the action of forces associated with the electric charges in the beam; provided the charge distribution does not oscillate with time, causing plasma instabilities or emittance growth.

After the scanner magnet 34, there is a bending magnet 36 that has a working gap 37 that produces a substantially static magnetic field which bends the beam in a plane orthogonal to the scanning plane. In this way, any neutral particles 39 previously generated by atomic interactions with the molecules of the residual vacuum are eliminated. The bending magnet also serves to further purify the beam with respect to ion momentum. The bending magnet 36 is positioned to compensate for deflections and displacements of the ion beam that may be caused by the secondary coils located in the scanner and collimator magnets.

It is preferable to locate the bending magnet 36 between the scanner and collimator magnets, as shown in FIGS. 1 and 2. In an alternative embodiment, the bending magnet is positioned before the scanner magnet 34, but in this arrangement any neutrals generated before the scanner magnet would tend to become preferentially implanted in the wafer along a strip region orthogonal to the scan direction and centered about the yz plane. If the bending magnet 36 is located after the collimator magnet, the neutral isolation is greatly improved, however this requires a very large gap in the bending magnet to accommodate the entire scan range of the collimated beam 32.

The collimator magnet 38 is positioned to receive the ion beam after the bending magnet 36. The collimator magnet 38 produces an oscillatory magnetic field that re-deflects the scanned beam into a time-averaged collimated beam 32 which parallel scans over the surface of the wafer to be irradiated.

Figure 3:
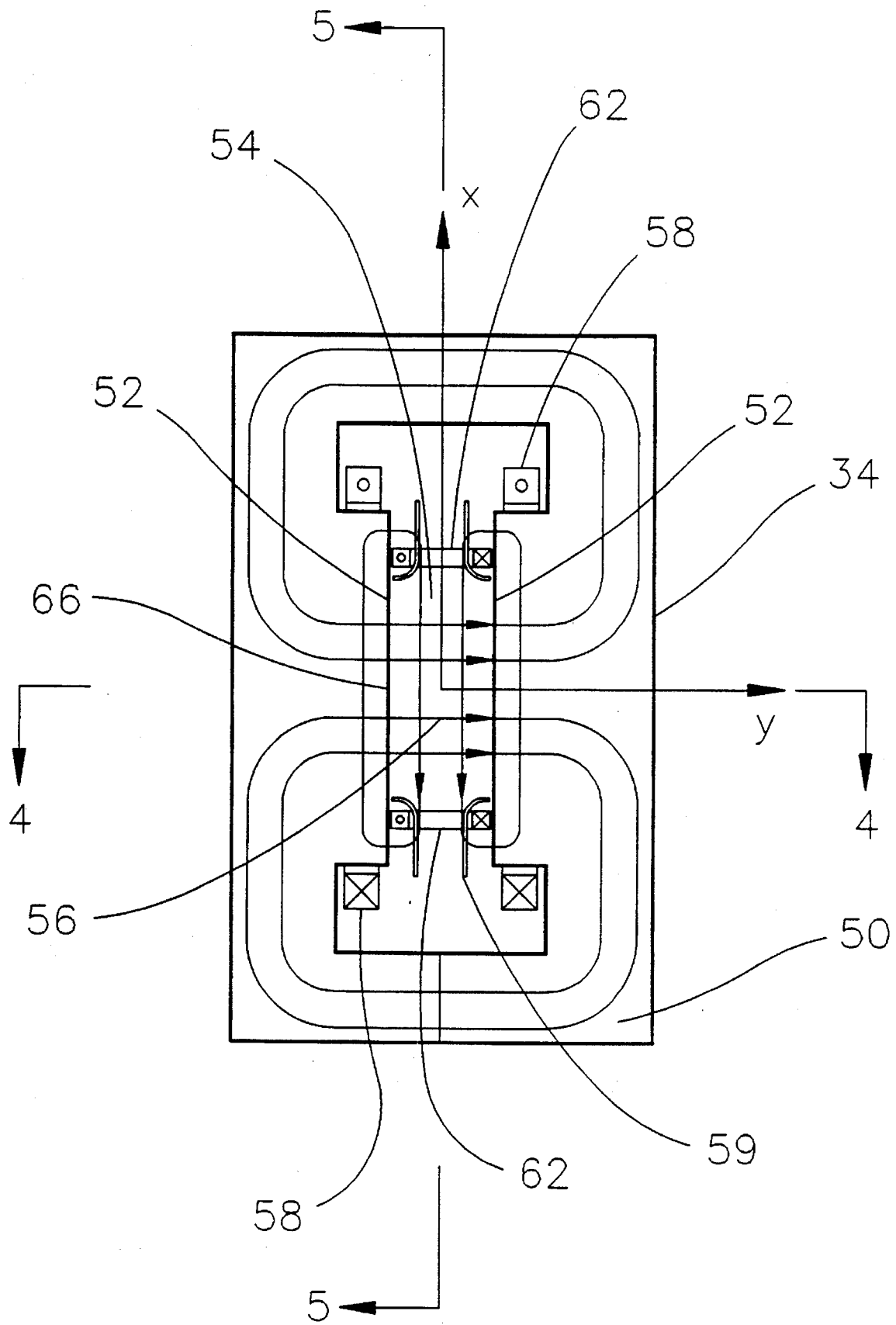
FIG. 3 is a cross-sectional view of the scanner magnet of FIG. 1 taken along the line 3—3.
Figure 4:
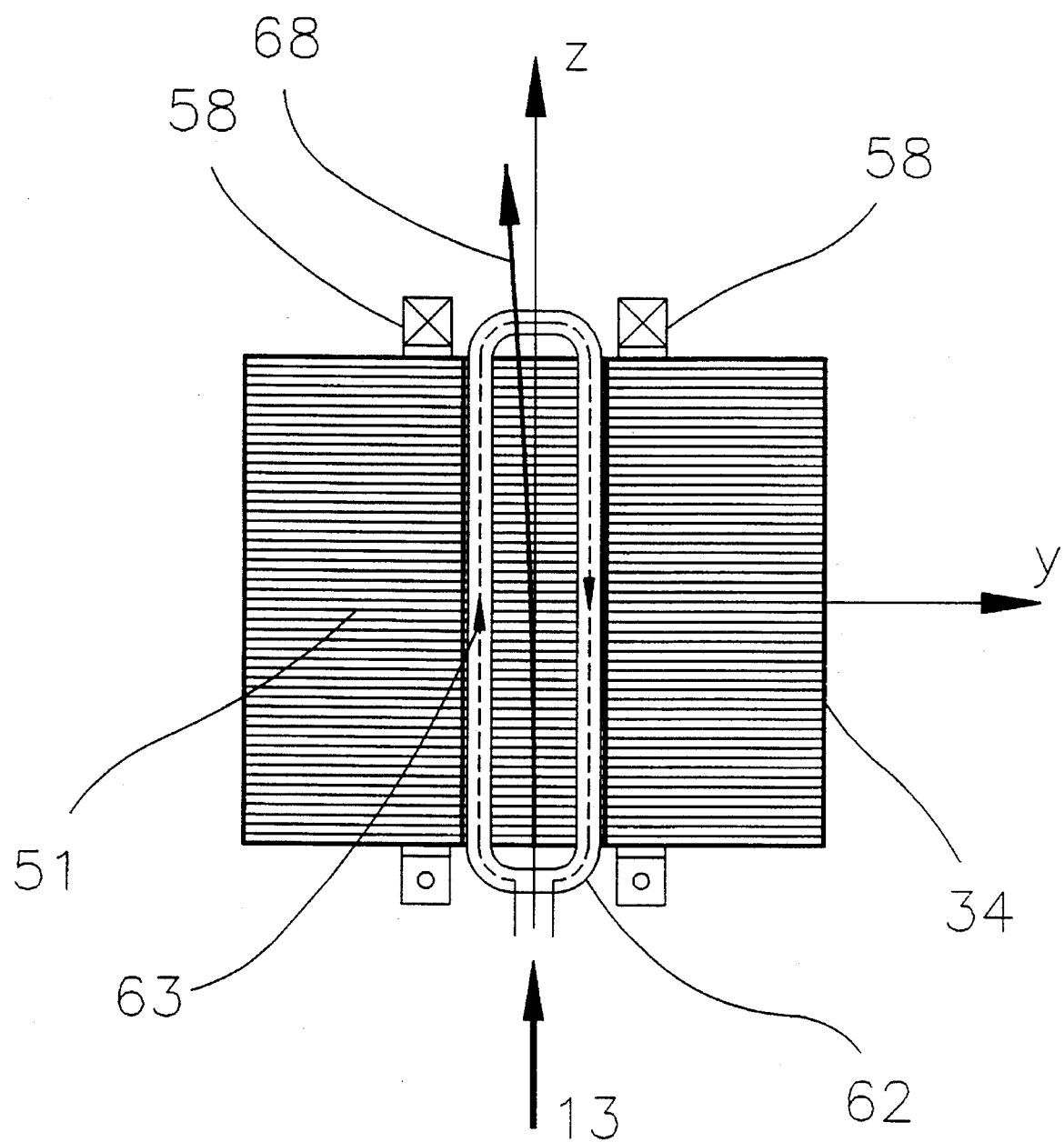
FIG. 4 is a further cross-sectional view of the scanner magnet of FIG. 1 taken along the line 4—4 in FIG. 3.
Figure 5:
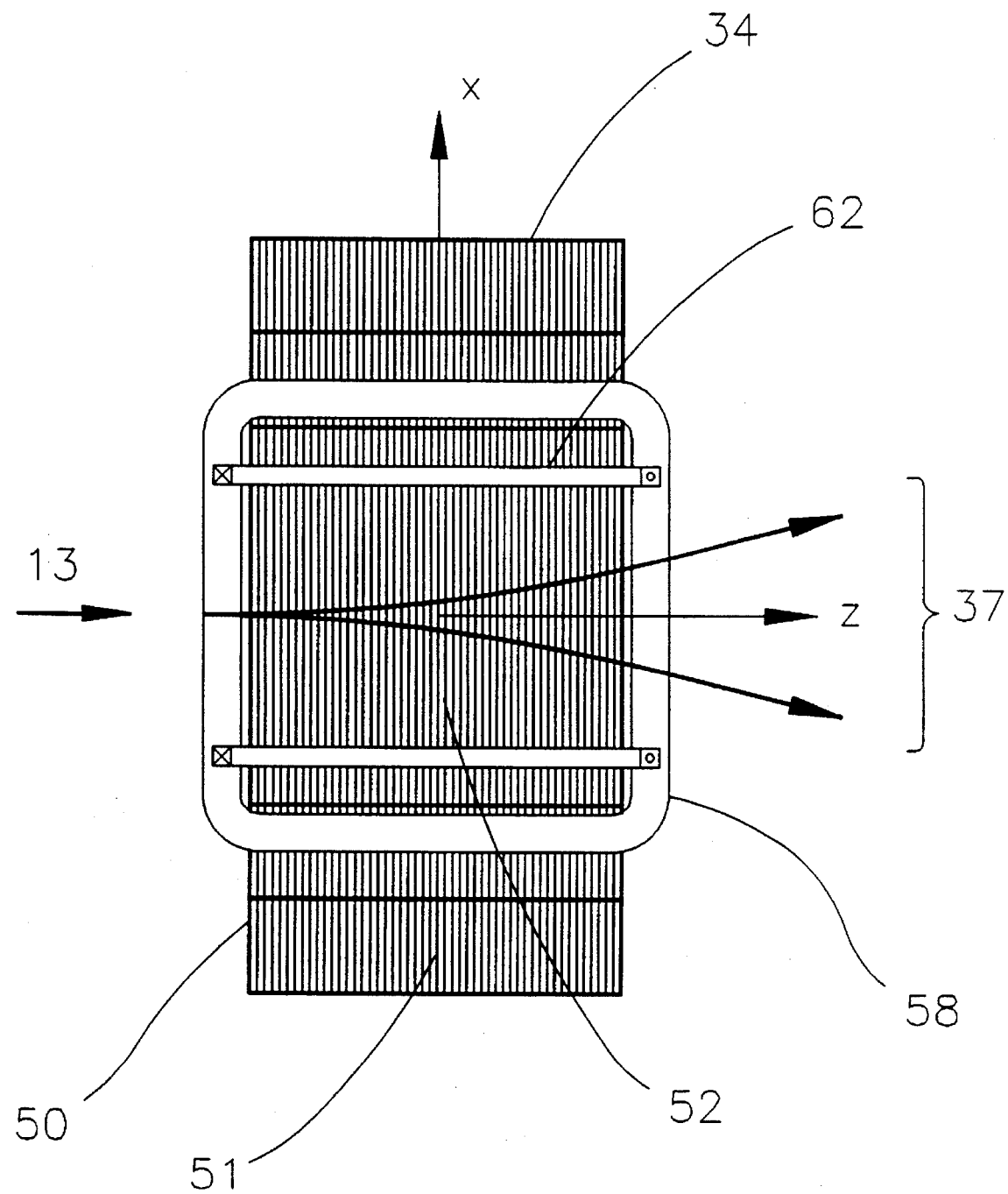
FIG. 5 is a further cross-sectional view of the scanner magnet of FIG. 1 taken along the line 5—5 in FIG. 3.

The basic structure of the scanner magnet 34 is shown schematically in FIGS. 3, 4, and 5. A yoke 50 is constructed from thin ferromagnetic laminations 51, which preferably have a thickness in the range of 0.2 to 1 mm, separated by much thinner inter-lamination insulating material (e.g., 0.03 mm epoxy impregnated cellulose). Such a laminated structure enables the efficient generation of strong magnetic fields in the working gap at high frequencies, which are suitable for the rapid deflection of heavy ions. Using a laminated magnetic circuit reduces the power requirements and reduces resistive eddy current losses relative to other conventional magnetic ion beam scanning techniques (see H. F. Glavish, U.S. Pat. No. 5,311,028, and H. F. Glavish, *Nucl. Instr. & Methods,* B74 (1993) 397, both of which are herein incorporated by reference).

Figure 19:
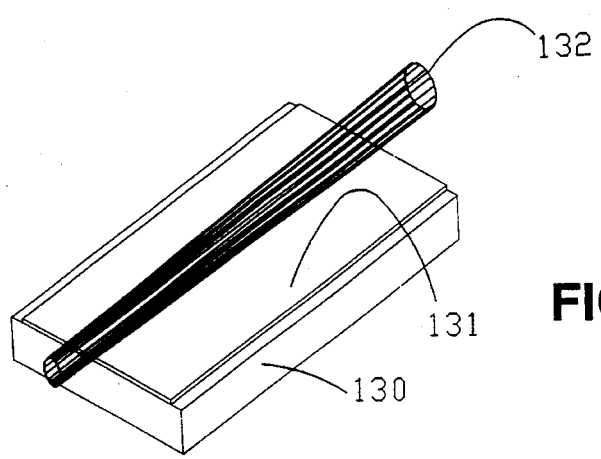
FIG. 19 is a perspective view of a silicon liner for shielding the pole surfaces of a magnet from an ion beam.

Other embodiments are contemplated, including the use of ferrite material instead of laminations for avoiding eddy current effects. However, because ferrite material is electrically insulating, it is preferred that the ion beam be shielded from the pole faces. Referring to FIG. 19, a thin silicon liner 131 is used to shield an ion beam 132 from a pole surface 130. Ions in the beam tend to strike the surfaces inside the ion beam system, which tends to cause particles to be released into the ion system. Since the liner is made of silicon, any contamination resulting from the liner would at least be compatible with, e.g., silicon wafer substrates, and would not tend to degrade the quality of the devices formed from the irradiated wafers. Also, because silicon is an electrical conductor it maintains a constant electrical potential in the proximity of the beam, yet the conductivity of silicon is sufficiently low that the silicon can be used in scanning magnets with acceptably small eddy current effects. A silicon liner can also be employed in bending magnet 36 to avoid sputtering contamination of the wafer.

Figure 6:
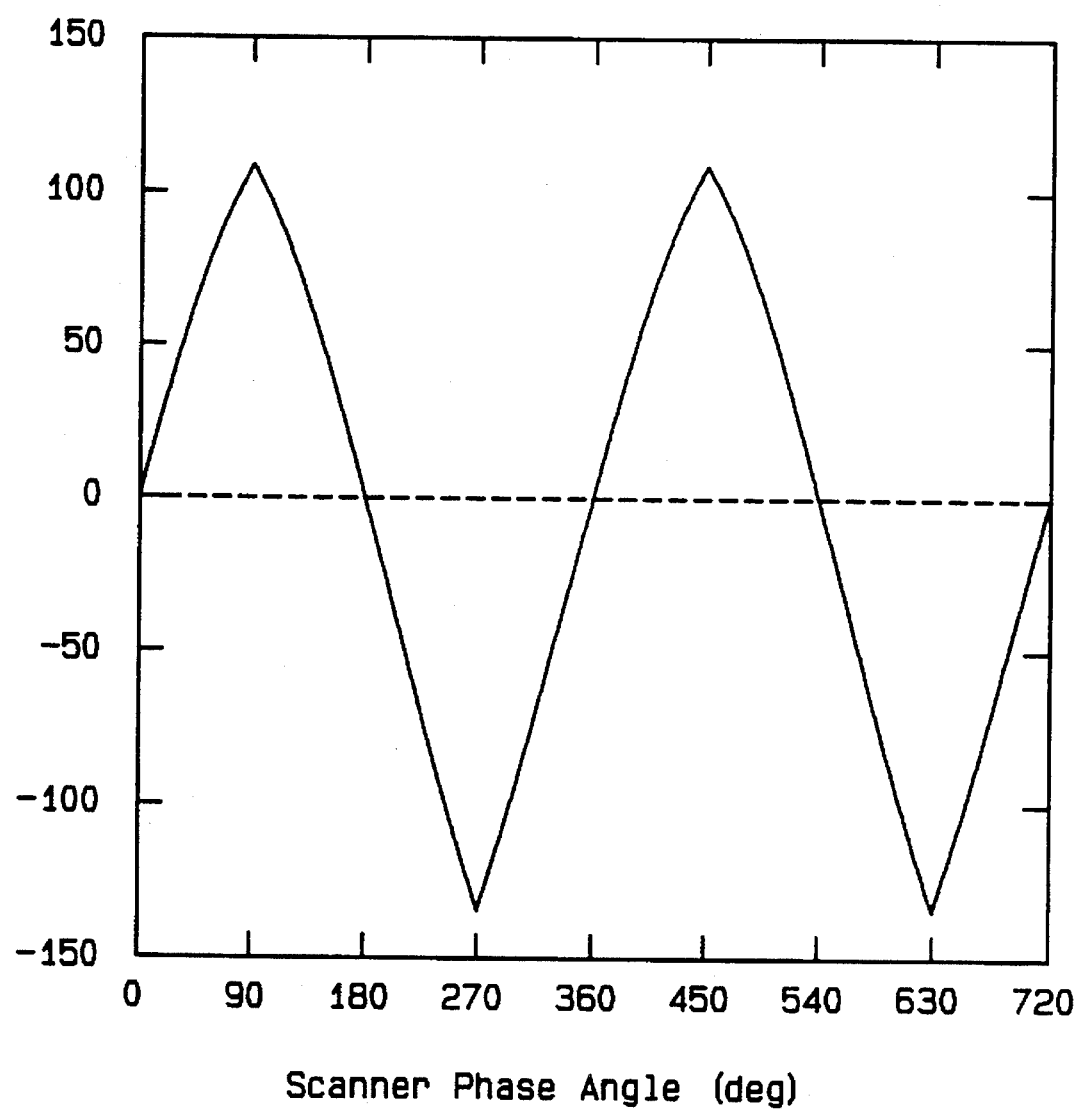
FIG. 6 is a schematic plot of the variation of an energizing current through a scanning coil as a function of time.

As shown in FIGS. 3–5, pole faces 52 define therebetween a working gap 54 which receives the high perveance, heavy ion beam 13. Scanning coils 58 are energized by power supply 60 (FIG. 1) with an electric current that alternates in polarity as shown in FIG. 6 to produce an oscillatory magnetic field 56 which causes the beam to scan back-and-forth (e.g., as indicated by reference number 37 in FIG. 5) in a plane parallel to pole faces 52.

An important aspect of the preferred embodiments of the invention is their capability to operate in a vacuum, without degrading the condition of the vacuum. Indeed, the beam is transported from the source 4 to the wafer 35 entirely in a high vacuum that is maintained inside an envelope 44 by vacuum pumps 46.

The scanner magnet is constructed so that it can operate satisfactorily when entirely mounted inside the vacuum envelope 44 shown in FIG. 1. Except for the negligibly small area of the edges of the inter-lamination insulation, the pole faces facing the beam are electrically conducting and are held at ground electrical potential to avoid generating electric fields in the vicinity of the beam, thereby preventing space-charge forces from affecting the transport of the beam through the scanner gap.

For the same reason, the insulating surfaces of the coils and the electrical leads to and from the coils are hidden from the beam by electrically grounded shields 59. If the vacuum envelope passed through the working gap and between the pole faces of the scanner magnet, the magnetic field volume and hence the power requirements would be substantially increased for a given free working gap in which to admit the beam. Furthermore, the material of the vacuum wall would need to be an electric conductor and not an insulator, in order to define a constant potential in the vicinity of the beam. In order to avoid large eddy currents from being induced in the vacuum walls, the vacuum walls themselves would have to be a semiconductor material or laminated structure similar to the scanner magnet, except that the laminations would be non-ferromagnetic.

Referring to FIGS. 3–5, secondary coils 62 are placed in the vicinity of the gap. Secondary coils 62 lie in planes normal to the pole surfaces 52 and thus do not inductively couple to the scanning coils 58. Therefore, secondary coils 62 can be energized independently of the primary coils of the scanning magnet. Power source 64 (e.g., a dc power supply) energizes the secondary coils with an electric current 63 to produce a magnetic field component 66 orthogonal to the oscillatory field component 56. Ground shields 59 are placed over the coil leads and the insulating surfaces of the coil to substantially eliminate electric fields in the vicinity of the high perveance, heavy ion beam.

As discussed above, the generation of a secondary magnetic field superimposed on the oscillatory field component substantially eliminates fluctuations in the beam size as the beam scans across the wafer, and therefore substantially improves the irradiance uniformity over the surface of the wafer.

The collimator magnet 38 has the same basic structure as the scanner magnet described above, including secondary coils. As shown in FIG. 1, the scanning and secondary coils of the collimator magnet are energized by power supplies 67 and 69, respectively. As shown in FIG. 2, the pole pieces 41 of the collimator are wider than those used in the scanner magnet to accommodate the deflection of the ion beam generated by the scanner 34. The dimension of the working gap is also greater to accommodate a larger beam dimension in a direction orthogonal to the scanning plane which results from the emittance related expansion of the beam that occurs under ballistic drift of the ions from the scanner magnet to the collimator magnet.

As previously remarked, in the absence of electric fields, a high perveance, heavy ion beam as defined in Eq. 1, above, can be deflected and focused by a static magnetic field, without necessarily experiencing any degradation in phase-space emittance resulting from internal space-charge forces. However, the inventors have realized that other conditions can occur in magnetic ion beam scanning that affect the uniformity, accuracy and repeatability of the technique.

Electrons of a few electron-volt energy are typically generated by the atomic interaction of the ions in the ion beam with the residual gas molecules in the vacuum system (see, e.g., in A. J. T. Holmes, *Beam Transport of the Physics and Technology of Ion Sources,* Ed. Ian G. Brown, John Wiley & Sons, New York 1989). In the vicinity of the ion beam, such electrons play an important role in neutralizing all but a small fraction of the positive charge associated with the ions of the beam. In some instances, neutralizing electrons are also generated directly from hot filaments or plasma guns, but this is not generally necessary for the transport of typical high perveance heavy ion beams through the magnets and field free regions found in a typical ion implanter. In the vacuums of approximately $10^{-6}$ torr used in ion implanters a sufficient number of electrons are generated by the beam, within fractions of a millisecond, to maintain the charge-neutrality of the beam.

Hitherto, it has been thought that detrimental time-dependent space-charge effects would be absent in magnetic scanning of ion beams used in ion implanters because of the very high rate of generation of electrons relative to the rate at which the transverse position of the beam changes. Indeed, to those skilled in the art, the magnetic field of the scanner are commonly regarded as quasi-static with respect to space-charge effects.

Figure 7:
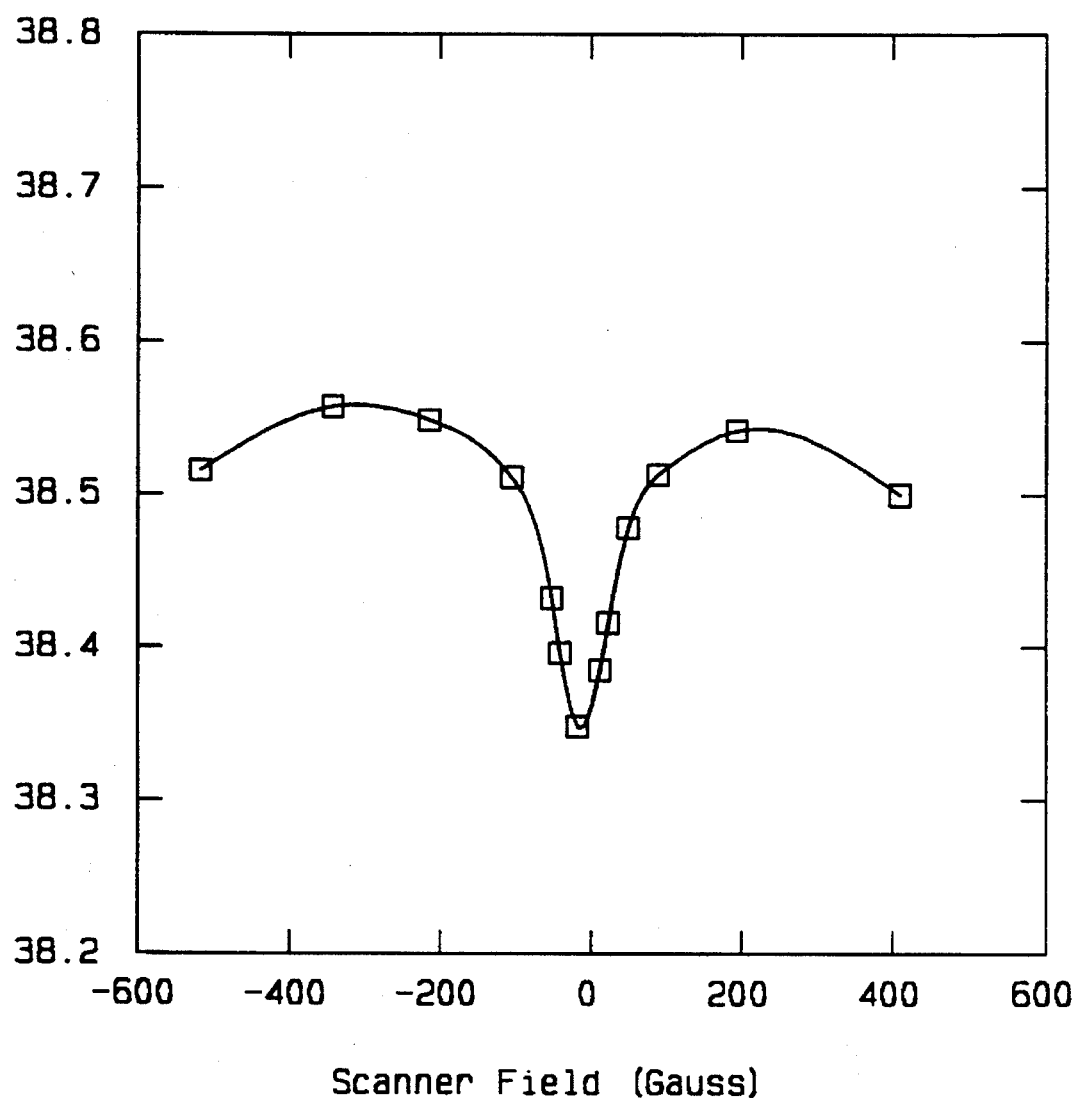
FIG. 7 is a plot of the variation in oxygen ion beam current at the wafer surface as a function of the magnitude of the scanner magnetic field.

However, we have discovered a plasma effect that manifests as a sudden change in the beam emittance when the magnitude of the magnetic field in the gap passes through or approaches zero. An example of our experimental data is shown in FIG. 7, which vividly illustrates how the current of a high perveance 178 keV, 150 Hz scanning oxygen beam undergoes a sudden fluctuation of ≅0.7% near a zero field. The data shown has been taken using a scan frequency of f= 150 Hz over a phase range of φ= −70° to φ=60° where φ= 360 ft. The oscillatory magnetic field (in Gauss) varied with phase according to the equation $$B = 706.5 \left(\frac{\phi}{90}\right) - 61.28 \left(\frac{\phi}{90}\right)^2 - 123.7 \left(\frac{\phi}{90}\right)^3 + 22.4 \left(\frac{\phi}{90}\right)^5 \quad (-90° \leq \phi \leq 90°) \quad (3)$$

The fluctuation near zero field shown in FIG. 7 is for just one scan sweep, but it accurately reproduces itself in successive scan sweeps. The measured beam current in the data shown in FIG. 7 is sensitive to changes that occur in the phase-space emittance of the beam in the direction transverse to the scan direction due to a limiting aperture that is placed before the current measuring apparatus. If the above-described effects are not substantially eliminated, or substantially compensated for by appropriate correction of the energizing waveform, a 1% or more irradiance non-uniformity can result.

In the presence of a magnetic field B, the neutralizing electrons of a beam experience the Lorentz force given by Eq. 2 and gyrate around the magnetic field lines with an angular frequency $$\omega = \frac{e}{m} B \quad (4)$$

where m is the mass of an electron and e is the charge of an electron. When projected on a plane perpendicular to B, the electrons describe a circle of radius $$r = \frac{mv_t}{eB} \quad (5)$$

where $v_t$ is the electron velocity component transverse to the direction of the magnetic field B. The energy associated with the orbital motion is $$U = \tfrac{1}{2} m v_t^2 \quad (6)$$

Figure 8:
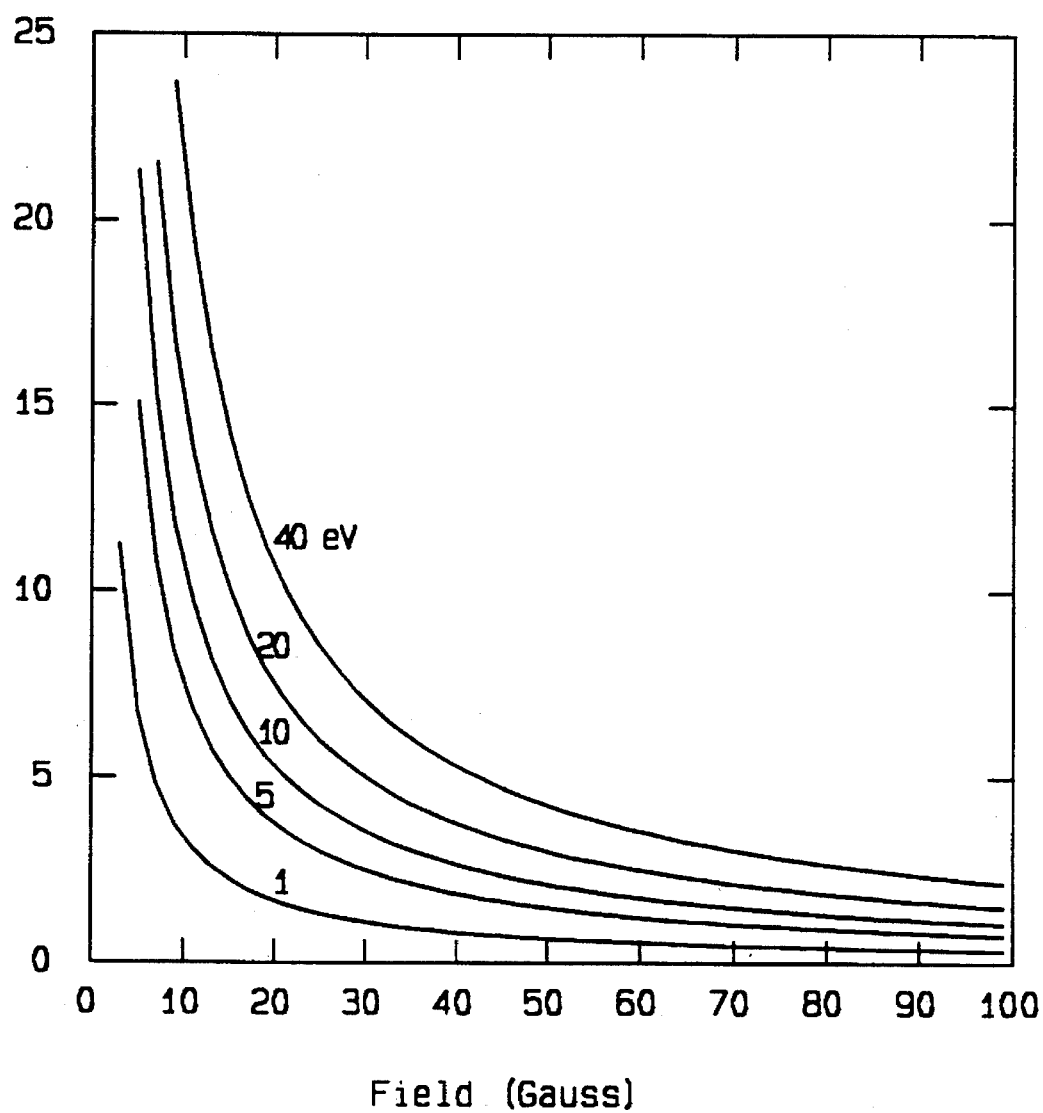
FIG. 8 is a plot of the gyro-radius of an electron as a function of magnetic field strength and electron energy.

Since the magnitude of the electron gyro-frequency (w≅17.6 MHz per Gauss) is much greater than the scan frequency of the magnetic field (~1 kilohertz or less), the electron orbital motion is adiabatic in the sense that for a small fractional change to occur in the radius r, an electron will make many revolutions around B. Referring to FIG. 8, the electron gyro-radius is plotted as a function of electron energy and magnetic field. At fields less than a few tens of Gauss the gyro-radius increases to the point where it becomes comparable to the beam dimension. However, this phenomena alone does not appear to account for the observed time-dependent fluctuation in the ion beam current, because in the absence of a significant magnetic field, the electron motion is determined principally by the forces associated with particle charges. Moreover, as previously discussed, beam neutralization occurs in a very short time relative to the time interval over which the fluctuation occurs (~1 millisecond).

Figure 9:
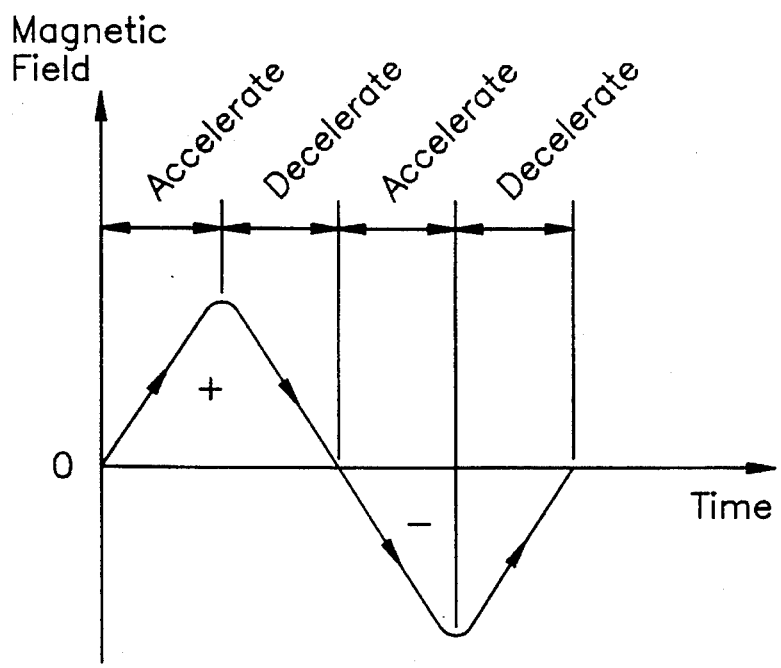
FIG. 9 is a plot of an oscillatory magnetic field as a function of time showing the regimes in which the inductive electric field accelerates or decelerates electrons.

To better account for the observed phenomena, we realized that, according to Maxwell's equations for the description of classical electromagnetic phenomena, there is associated with the time variation of the scanner field B, an electric field E given by $$\nabla \times E = -\frac{\partial B}{\partial t} \quad (7)$$

and that such a field must inductively accelerate, or decelerate, electrons according to whether the amplitude of B is increasing or decreasing, as shown in FIG. 9. Indeed, the change in orbital energy per revolution is $$\delta U = \oint eE \times ds = e \int_S (\nabla \times E) \times dS = -e \int_S \frac{\partial B}{\partial t} \times dS \quad (8)$$

If we now invoke the adiabatic condition that the radius is essentially constant for one revolution, we obtain from Eqs. 4, 5, and 6.

$$\delta(U/B)=0$$

$$\delta(r^2B)=\delta(r^2U)=0 \quad (9)$$

The first of these equations shows that the electron rotational energy changes proportionately with the magnetic field strength. The second equation expresses the conservation of angular momentum and shows that the area $\pi r^2$ of an electron orbit varies inversely with the amplitude of the magnetic field strength and electron energy. The effects arising from the inductive electric fields are significant. For example, as the field increases from say 5 to 50 Gauss, the electron density is compressed by a factor of 10. The electron energy is also increased by a factor of 10 and in the presence of the magnetic field the electrons are bound to a region in the vicinity of the beam. New electrons that are generated as the magnitude of the magnetic field is increasing are also subject to the compression resulting from the inductive acceleration. In this regime, the electron spatial distribution is dominated by the action of magnetic field rather than by the action of the system of ion charges in the beam.

As the field increases beyond 50 Gauss, compression continues to occur but the effect is not so dramatic because the gyration radius of the electron is already substantially less than the typical transverse dimension of the beam.

When the magnetic field amplitude decreases towards zero the electron orbits expand according to Eq. 9. When the magnetic field strength is less than approximately 50 Gauss, the electrons in the electron orbits that were previously compressed are now rapidly decelerated and expand over an area that is comparable to or greater than the beam cross section. New electrons that are generated, already have a low energy, and are not so significantly affected by the inductive electric field.

Figure 10:
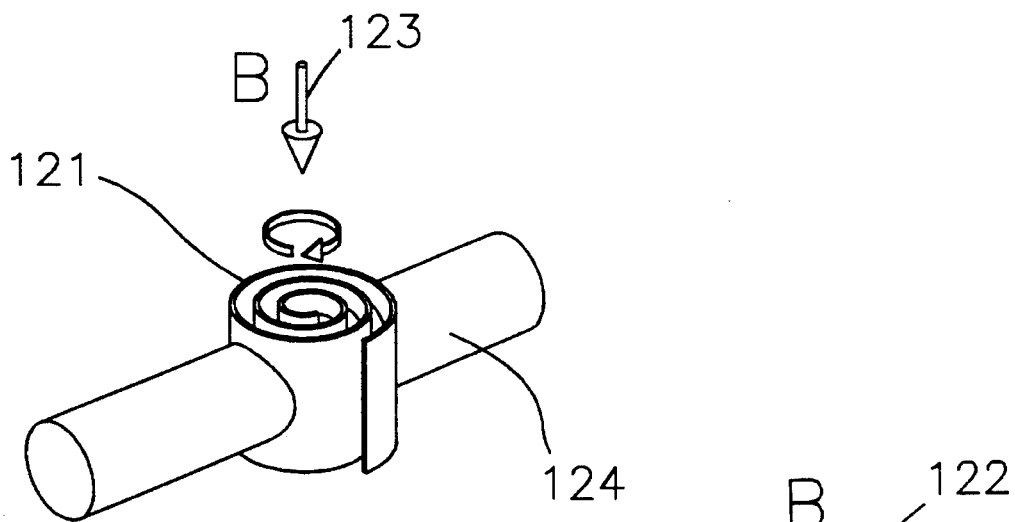
FIG. 10 is a schematic diagram illustrating how inductive deceleration causes the orbits of electrons in an ion beam to spiral outward as the magnetic field amplitude decreases with time.
Figure 10A:
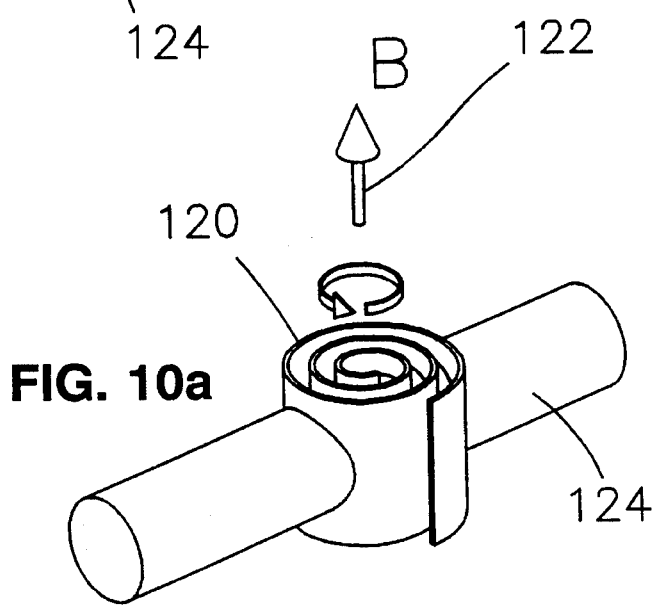
FIG. 10A is a schematic diagram illustrating how inductive acceleration causes the orbits of electrons in the ion beam to spiral inward as the magnetic field amplitude increases with time.

The sequence of events occurring in the scanner with elapsed time is schematically illustrated in FIGS. 10 and 10A.

Referring to FIG. 10, as the magnetic field 123 approaches zero the inductive deceleration causes electron orbits to describe an outward spiraling envelope 121 thereby reducing the electron density in the region of the ion beam 124. After the magnetic field passes through zero it has the opposite direction and the rotation direction of the electron orbits 120 are reversed, as shown in FIG. 10A. As the magnetic field 122 now increases in amplitude, inductive acceleration causes the electron orbits to adiabatically spiral inward thereby increasing the electron density in the region of the ion beam 124. The rapidly changing electron density caused by the magnetic field passing through zero provides a plausible explanation for the observed fluctuations in the phase-space emittance of the ion beam.

Experimental observations have only been made on magnetically scanned high perveance positive heavy ion beams. However, since electrons are produced at a very high rate by negative ion beams and are a part of the overall beam neutralization phenomena in both the negative and the positive potential plasma regimes, it is expected that similar fluctuations will occur and that the present invention will also have important application for the scanning of high perveance negative ion beams.

As shown in FIGS. 4 and 5, the secondary coils 62 extend along the entire length of the scanner magnet and produce a secondary field component $B_s$ which is superimposed on the primary magnetic field B generated by the scanning coils. The amplitude of the oscillatory scanning magnetic field passes through zero, twice every scan cycle. However, the resultant field vector $B_r = B_s + B$ never passes through zero, but instead rotates in the x-y plane as shown in FIG. 11.

Figure 11:
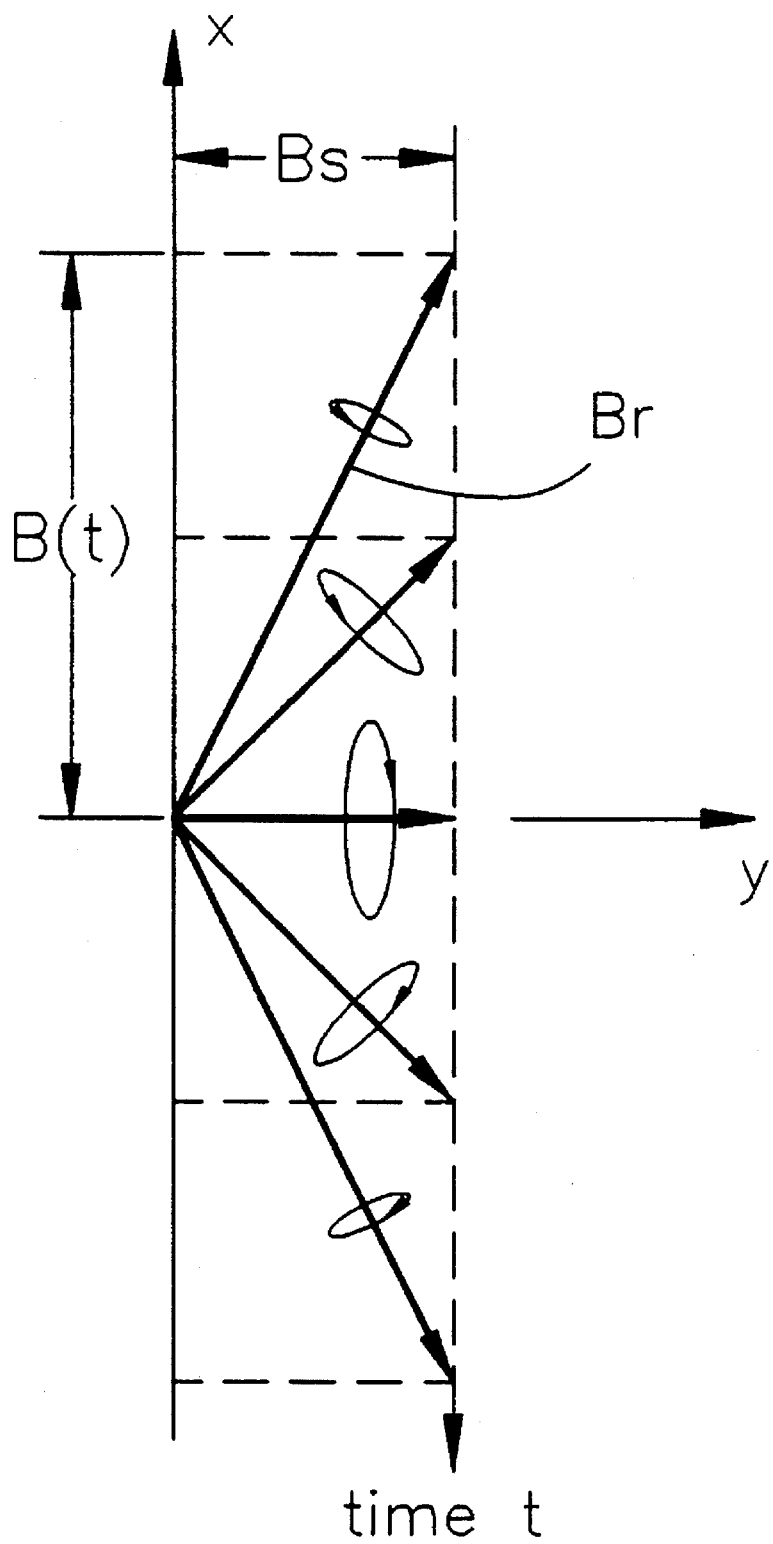
FIG. 11 is a schematic diagram of the rotation in direction and variation in magnitude over time of a magnetic field composed of an oscillatory component and an orthogonal static component, and the adiabatic electron orbits about the changing resultant magnetic field.

As previously remarked, the orbital rotation frequency of the electron around the magnetic field is very rapid and therefore the electron orbit projected onto a plane perpendicular to the resultant magnetic field vector adiabatically follows this vector as it rotates around the beam axis as shown schematically in FIG. 11. Since the entire motion is adiabatic, the changes in inductive energy and the conservation of angular momentum, as given by Eq. 9, still apply, except now the degree of adiabatic compression and expansion is greatly reduced. Indeed, adverse effects on the beam phase-space emittance arising from the redistribution of electron charge become negligibly small according to the data of FIG. 7 and the theoretical considerations previously stated, if the amplitude of secondary field is greater than approximately 50 to 150 Gauss when the oscillatory field is within the range of approximately ±200 Gauss of zero.

Another important aspect of the invention is that the secondary coil can be independently energized with a current to achieve the secondary magnetic field since the secondary coil is not inductively coupled to the scanning coil. Moreover, the secondary coil can be excited with a dc current so that it produces a small but constant out of plane deflection of the emerging beam 68 (see FIG. 4) irrespective of the scan deflection.

The magnitude of the out of plane deflection angle is $$\theta = \sin^{-1}\left(\frac{LB_s q}{Mv}\right) \quad (10)$$

where L is the effective length of the scanner in the z-direction. The position and bend angle of the sector magnet 36 is selected to compensate for the out of plane deflection according to Eq. 10 that is produced by the scanner and collimator magnets.

In operation, the amplitude of the secondary field $B_s$ may be set, according to Eq. 10, for the lowest ion momentum to charge ratio My/q, and thereafter increased in proportion to Mv/q to maintain a constant value for θ.

Figure 12:
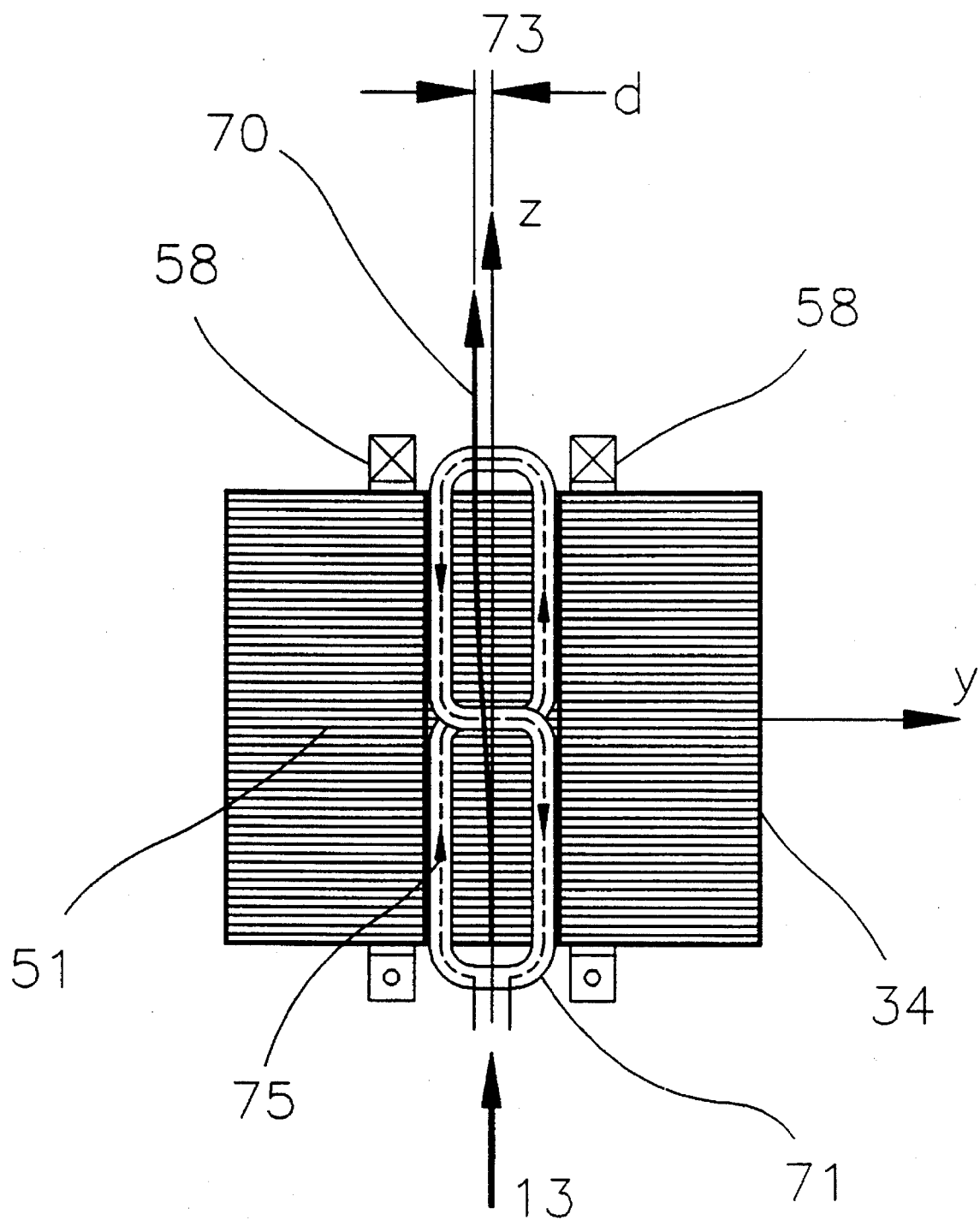
FIG. 12 is a cross-sectional view of oppositely energized adjacent loops in a two loop secondary coil oriented to produce a secondary magnetic field orthogonal to the oscillatory magnetic field direction.

In another preferred embodiment, shown in FIG. 12, each of the pair of secondary coils has coplanar adjacent loops 71 oppositely energized with a common electric current 75 and with areas selected to eliminate inductive coupling with the scanning coils. Referring to FIG. 12, the planes of the secondary coils are orthogonal to those of the pole faces, and the lengths of the adjacent loops, along the dimension parallel to the ion beam, are equal so as to substantially eliminate any net out of plane deflection angle, thereby producing only a small net displacement 73 (d) of the ion beam 70 as illustrated.

Figure 12A:
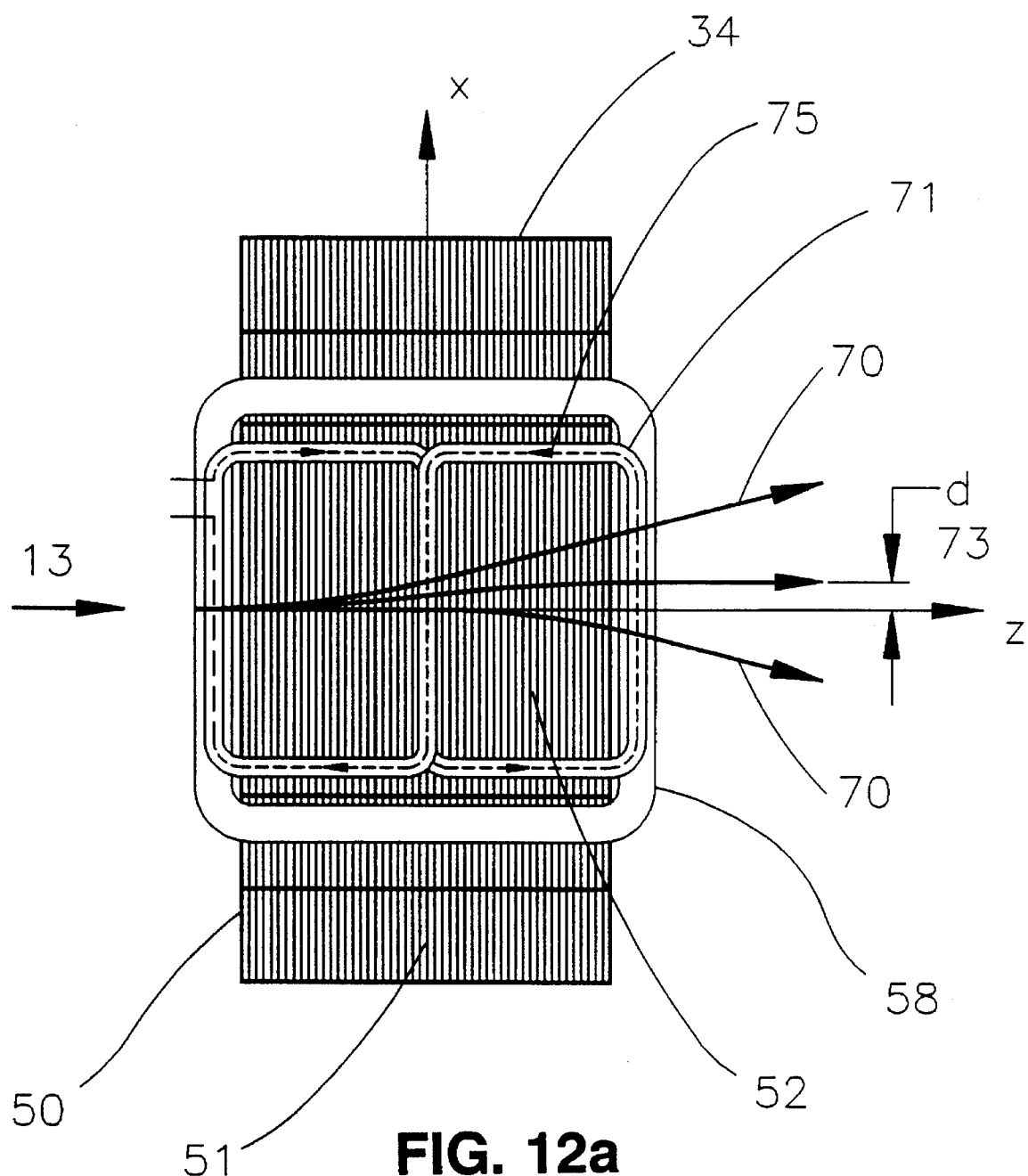
FIG. 12A is a cross-sectional view of oppositely energized adjacent loops in a two loop secondary coil oriented to produce a secondary magnetic field parallel to the oscillatory magnetic field direction.

Because there is no net inductive coupling to the scanning coils, irrespective of the planes of orientation of the secondary coils with respect to the planes of the scanning coils, the secondary coils can be substantially orthogonal to, substantially parallel to, or at any other orientation with respect to the pole faces. FIG. 12A illustrates the case when the plane of the loops is parallel to the pole faces. In this case, the net deflection angle is once again zero and there is only a net displacement of the beam but now the displacement 73 is parallel to the scan plane.

To avoid fluctuations in the beam emittance associated with a time-varying field passing through zero as previously described, the strength of the secondary magnetic field $B_s$ must be 50 to 200 Gauss greater than the peak component of oscillatory field normal to the plane of the secondary coils. Specifically, if $B_p$ is the peak value of the oscillatory field, then $$|B_s| - \frac{|B_p \times B_s|}{|B_s|} \geq 50 \text{ to } 200 \text{ Gauss} \quad (11)$$

As in the case of the previously described embodiment, an important aspect of the invention is that the secondary coils can be independently energized with a current to achieve the secondary magnetic field since the secondary coils are not inductively coupled to the scanning coils. Moreover, the secondary coils can be conveniently excited with a dc current so that the net displacement or offset 73 (d)

$$d \approx \frac{L^2 B_s q}{Mv} \quad (12)$$

of the emerging beam 70 (see FIG. 12a) is independent of the scan deflection angle. The relative positions of the working gaps of the sector magnet 36 and collimator magnet 38 with respect to the scanner magnet 34 are set to take into account displacements as given by Eq. 12.

In operation, the amplitude of the secondary field $B_s$ may be set according to Eq. 11 for the lowest ion momentum to charge ration Mv/q, and otherwise increased in proportion to Mv/q as Mv/q increases to maintain a constant value for d.

When adjacent loops are used in the secondary coils, the secondary field vanishes along a line singularity approximately mid-way between the adjacent loops of the secondary coils. Depending on the detailed design, the secondary field gradient may be sufficient to prevent any significant changes in beam size as a result of this zero field line singularity. The singularity can be avoided in a variation of the embodiment wherein the scanner magnet is segmented into two parts with an intermediate iron field clamp 74 as shown schematically in FIGS. 13 and 13a. The embodiment is now functionally equivalent to a sequence of two scanners of the type illustrated in FIG. 3, but with the loops 71 of secondary coils energized in series in an opposite sense from a common power source 64, and the scanning coils 58 energized in series in the same sense from a common power source. Magnetically, the situation half-way along the scanner is now just the same as at the entrance or the exit of the scanner where the oscillatory magnetic field is always zero throughout the scan cycle. Again, the planes of the secondary coils can have any orientation with respect to the plane of the scanning coils without there being a net inductive coupling to the scanning coils.

Figure 14:
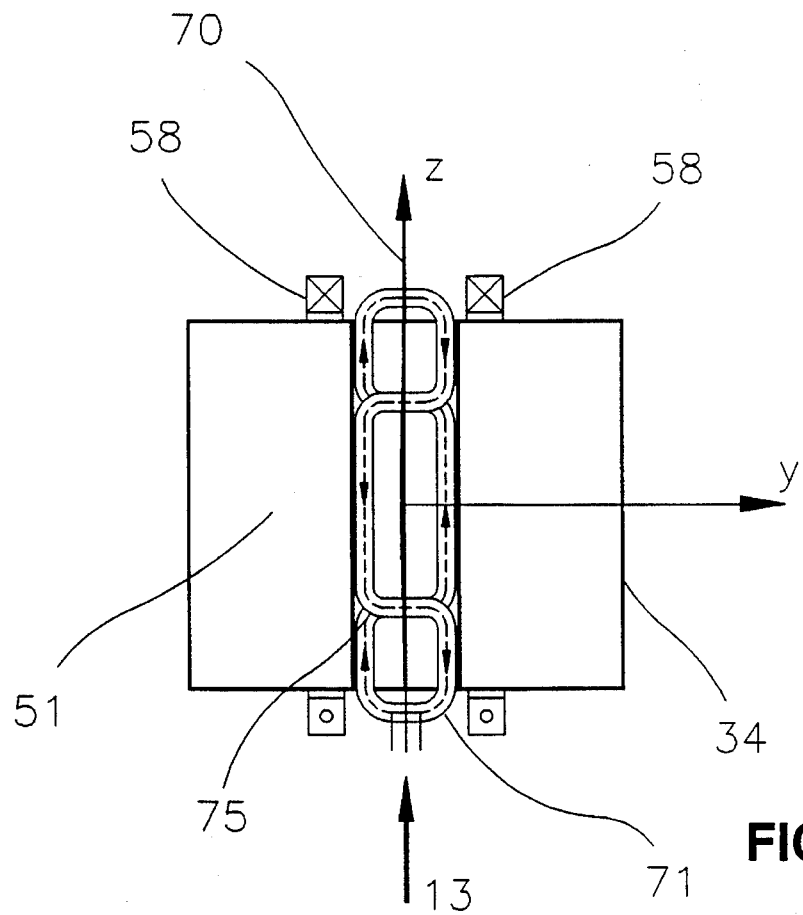
FIG. 14 is a cross-sectional view of oppositely energized adjacent loops in a three-loop secondary coil oriented to produce a secondary magnetic field orthogonal to the oscillatory magnetic field direction.
Figure 14A:
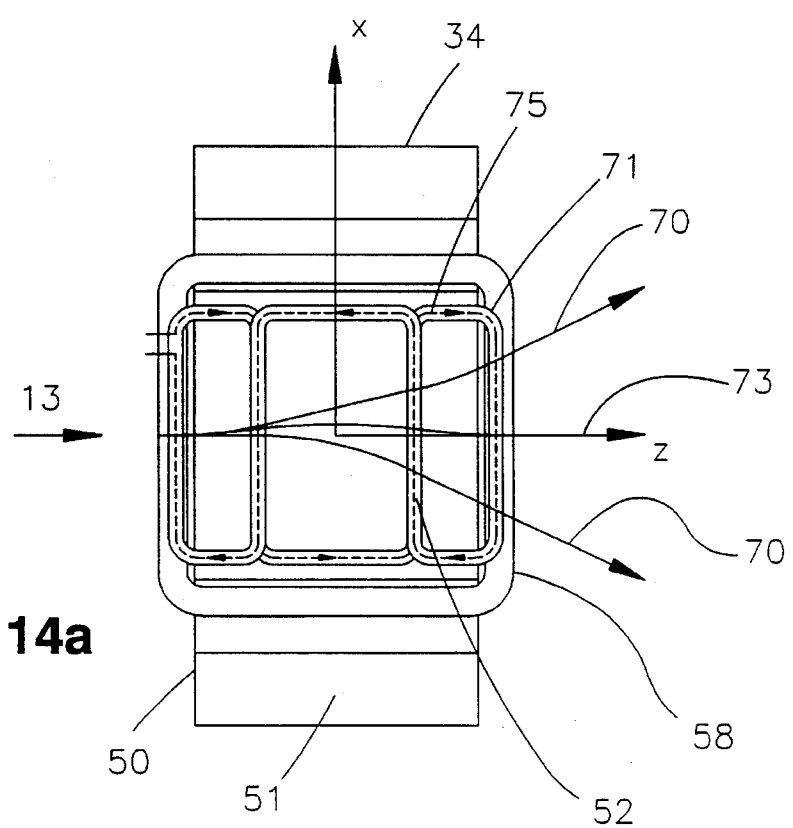
FIG. 14A is a cross-sectional view of oppositely energized adjacent loops in a three-loop secondary coil oriented to produce a secondary magnetic field parallel to the oscillatory magnetic field direction.

In an alternative embodiment, shown in FIGS. 14 and 14A, the secondary coils are further adapted with three adjacent coplanar loops oppositely energized to each other and with loop areas selected so as the entire secondary coil is not inductively coupled to the scanning coils. As the ion beam passes through the gap it passes through the three regions corresponding to the locations of the three adjacent loops the secondary magnetic field generated by each loop is opposite to that generated by the adjacent loop.

Referring to FIG. 14, the planes of the loops are oriented in an orthogonal direction to the planes of the scanning coils and the center-loop is twice the length of the end loops along the beam direction, in which case the secondary magnetic field component does produces neither a net displacement nor a net deflection of the ion beam 70.

Because there is no net inductive coupling to the scanning coils, irrespective of the planes of orientation of the secondary coils with respect to the planes of the scanning coils, the secondary coils can be disposed to be substantially orthogonal to, or substantially parallel to, or at any other orientation with respect to the pole faces. As shown in FIG. 14A the planes of the loops are parallel to the pole faces. To avoid fluctuations in the beam emittance associated with a time-varying field passing through zero as previously described, the strength of the secondary magnetic field $B_s$ must be 50 to 200 Gauss greater than the peak component of oscillatory field orthogonal to the plane of the secondary coils as stated in Eq. 11.

Figure 13:
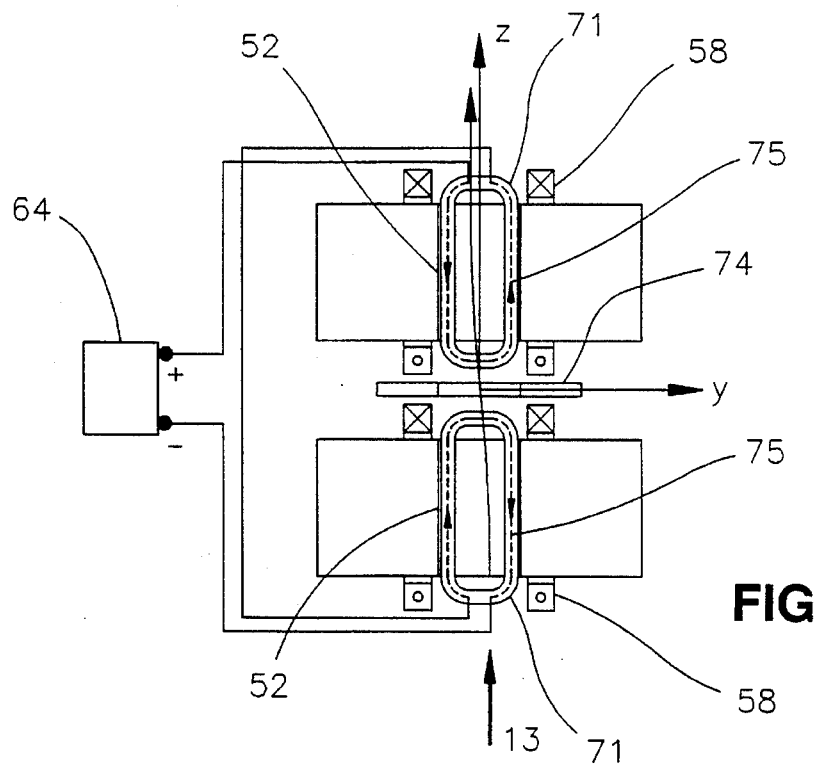
FIG. 13 is a cross-sectional view of a scanner magnet segmented into two parts with each part having an adjacent loop of an oppositely energized secondary coil oriented so as to produce a secondary magnetic field orthogonal to the oscillatory magnetic field direction.
Figure 13A:
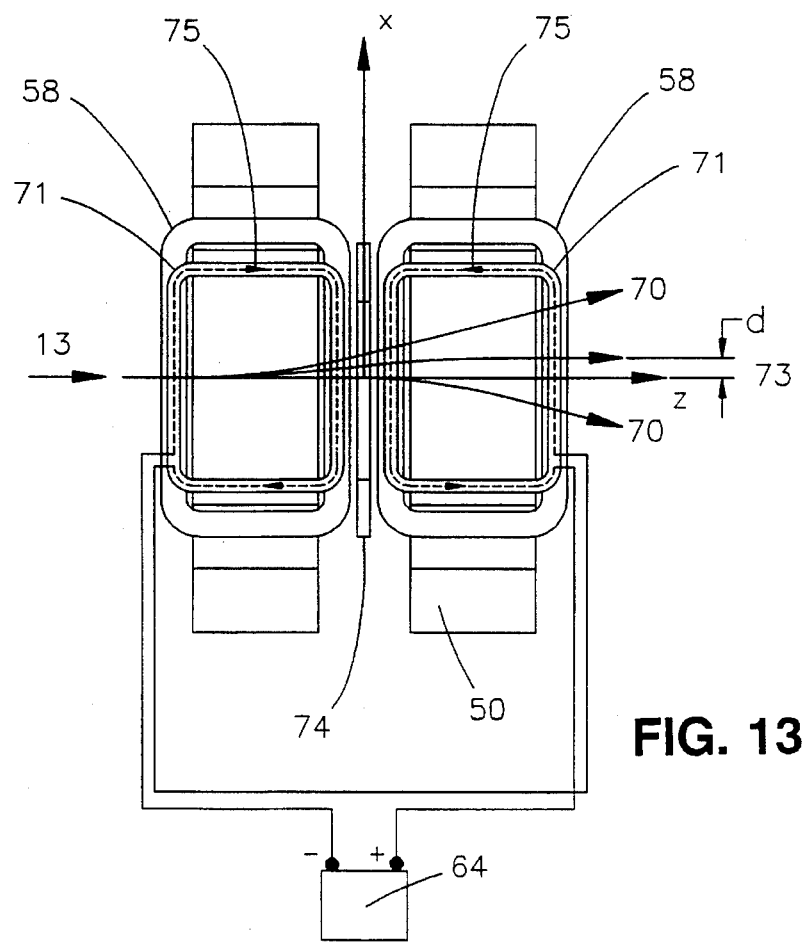
FIG. 13A is a cross-sectional view of a scanner magnet segmented into two parts with each part having an adjacent loop of an oppositely energized secondary coil oriented so as to produce a secondary magnetic field parallels to the oscillatory magnetic field direction.

If necessary, the zero field line singularities occurring in the regions between adjacent loops can be eliminated by segmenting the scanner magnet into three parts in an analogous way to the two part segmentation shown in FIGS. 13 and 13B.

Other preferred embodiments include secondary coils with more than three loops with respective coplanar areas selected to eliminate inductive coupling with the scanning coils and energized with sufficient electric current according to Eq. 11 to avoid fluctuations in beam emittance associated with a time-varying field passing through zero as previously described.

Figure 16:
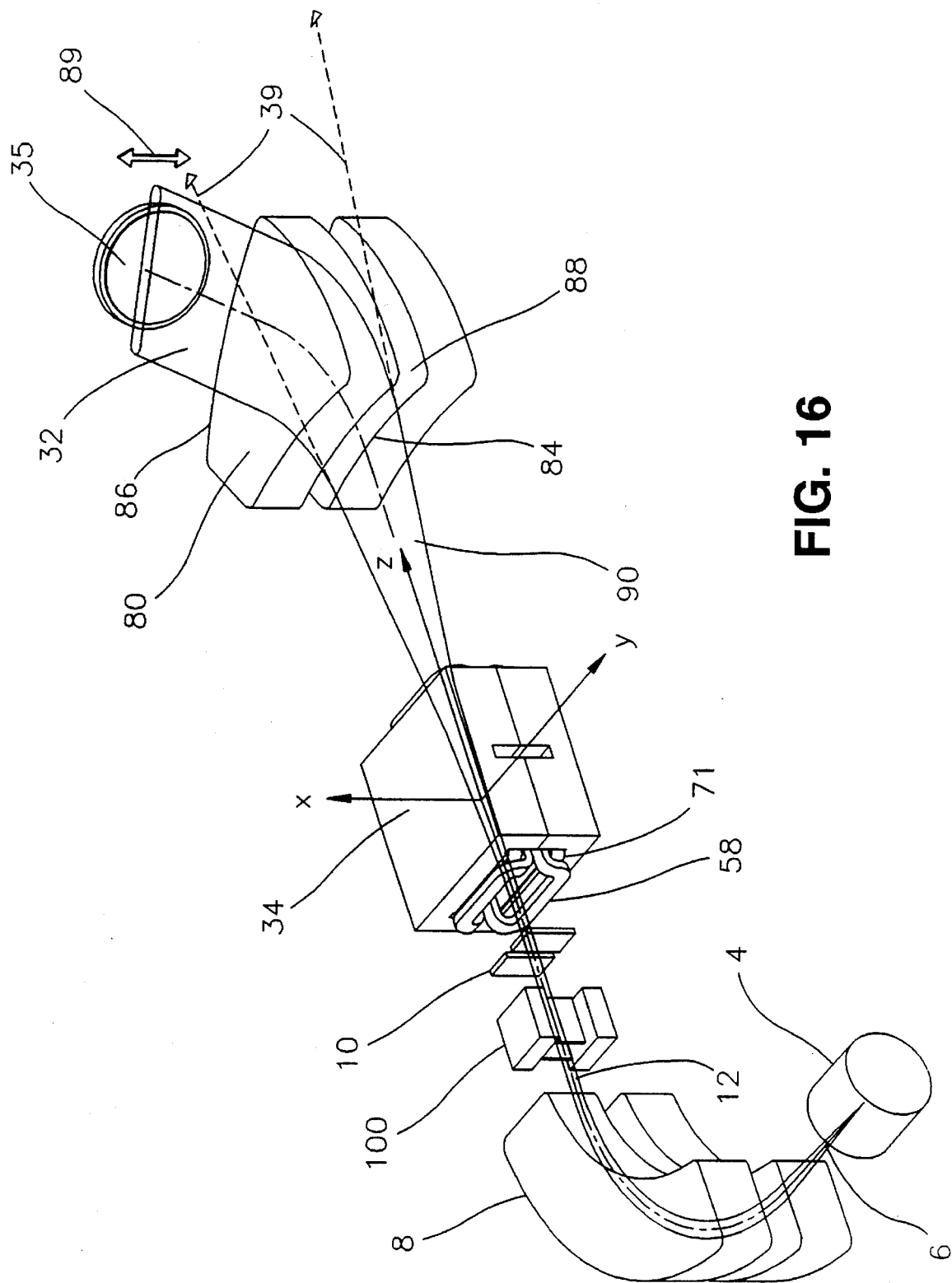
FIG. 16 is a perspective view of certain components of the ion beam system shown in FIG. 15.
Figure 17:
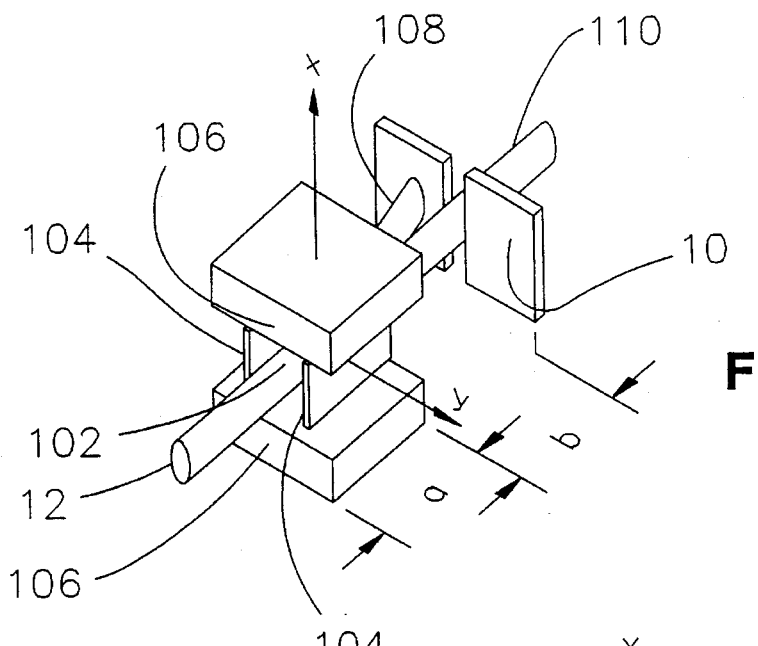
FIG. 17 is a perspective view of a velocity separator acting on an ion beam.

Referring to FIGS. 15 and 16, in another alternative embodiment heavy ions are derived from an ion source 4 producing an ion beam 6 that generates and traps electrons within it to become nearly electrically neutral in the absence of external electric fields and insulating surfaces. The ion beam 6 undergoes ballistic drift under a vacuum to a sector magnet 8 and is momentum purified after passing through a resolving slit 10, according to the ratio of the ion momentum to electric charge (My/q) where v is the ion velocity, q is the ion electric charge, and M is the ion mass, as previously defined in Eq. 1.

The system shown in FIG. 15 obtains higher final ion energies, not by using a post accelerator, but by extracting doubly or triply charged ions (e.g. $P^{++}$ or $P^{+++}$) from the ion source. When multiply charged ions are used, the sector magnet alone does not always adequately purify the beam. For example, singly-charged ions $P^+$ can be formed from the dissociation of a molecular ion as follows

(13)

In the drift region, between the ion source 4 and the sector magnet 8, these singly-charged ions have one half the velocity of doubly charged ions $P^{++}$ which have been extracted directly from the ion source. The momentum-to-charge ratio is therefore the same for the two types of ion and they will not be separated at the resolving slit by the sector magnet.

To overcome this problem, a velocity separator 100 is placed between the sector magnet and the resolving slit (see, e.g., C. A. Coombes et al., *Phys. Rev.*, vol. 112, p. 1303 (1958)). Pole pieces 106 define a working gap 102 to receive the beam and produce a magnetic field in the x direction. Electrodes 102 produce an electric field in the y direction. The strengths E and B of the electric and magnetic fields are respectively set as follows $$E \geq \frac{VS_w}{ab} \quad (14)$$

$$B = \frac{E}{v}$$

where v is the velocity of the doubly-charged ion to be selected, V is the extraction voltage of the ion source, $S_w$ is the width of the resolving slit 10, a is the effective length of the working gap of the velocity separator, and b is the drift distance from the exit of the velocity separator to the resolving slit. The first of equations (14) ensures the electric field strength is sufficient to reject the singly-charged ions 108 at the resolving slit, while the second equation ensures the magnetic and electric forces acting on the doubly-charged ions cancel, allowing ions 110 to pass through the separator without being deflected.

Figure 18:
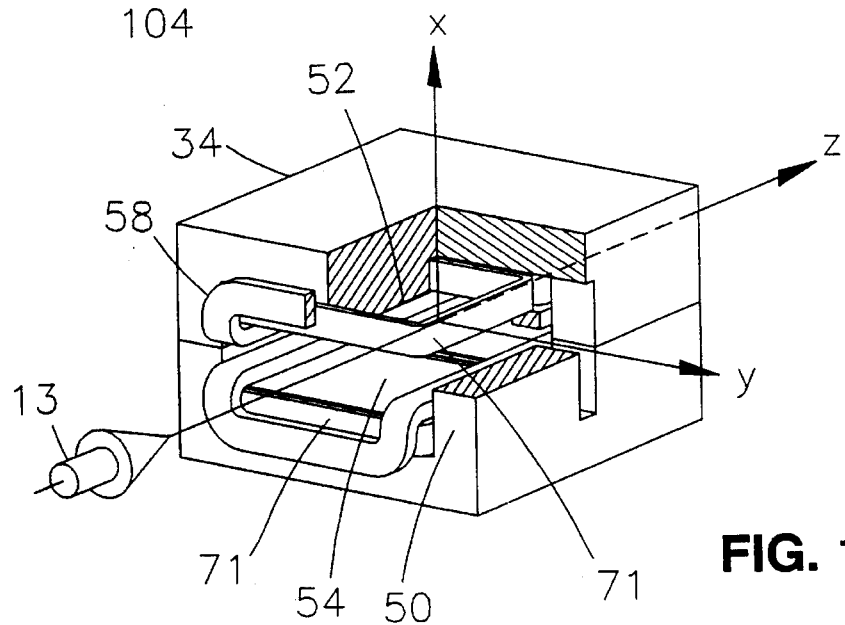
FIG. 18 is a perspective view of the scanner magnet shown in FIG. 15.

The beam 13 emerging from the resolving slit 10 passes into a scanner magnet 34 as previously described and shown in FIG. 18. The secondary coils 71 are of the form shown in FIG. 12A. The scanner magnet is oriented so that the scanning plane is the yz plane, as shown in FIG. 16. The scanned beam 90 emerging from the scanner magnet is collimated by a sector collimator magnet 80 that produces a substantially static uniform magnetic field in a working gap 88 with entrance 84 pole edge and exit 86 pole edge. The pole edges are especially contoured to form a parallel scanned beam 32 at wafer 35.

Referring to FIGS. 15 and 16, an important aspect of the invention concerns the cooperation of the sector collimator magnet 80 with the scanner magnet 34 in regard to the different paths the beam takes to the wafer at different times during the scan cycle. The contours of the entrance and exit pole edges 84, 86 are fourth order polynomials with coefficients chosen to simultaneously achieve the following ion optical transport and focusing conditions while the beam is impinging on the wafer, irrespective of scan position:

1. Maintain a parallel scan as previously described to a precision of better than ±0.5° and preferably ±0.2°.
2. Maintain the range of variation of the prescribed maximum angular divergence of the beam (typically about 0.5° to 1.5°) substantially within a limit of ±0.5°.
3. Maintain the prescribed transverse beam size (typically 30 to 50 mm) substantially within a limit of ±5 mm.
4. Produce sufficient deflection of the beam (e.g., at least about 30°, and more preferably greater than about 45°) to minimize the number of neutral particles 39 striking the wafer after being formed by the ions of the beam interacting with residual gas molecules in the vacuum system prior to the beam entering the sector collimator magnet.

In general, a conventional sector magnet with pole edge contours limited to second order curvatures on the entrance and exit pole edges cannot achieve all of the above-mentioned requirements simultaneously (see, e.g., H. A. Enge, "Deflecting Magnets," published in *Focusing of Charged Particles,* vol. II, Ed. A. Septier, Academic Press, New York (1967). The limitations of second order curvatures is underscored if the collimator deflection becomes larger than about 30°, and more preferably larger than about 45°. Fourth order contours on the entrance and exit pole edges of the sector collimator enables such large angle deflections to be achieved, which results in satisfactory isolation of the wafer from neutral particles, and yet allows the above-mentioned ion optical transport and focusing constraints to be realized.

In this embodiment, as in the above-described embodiments, the working gap 88 of the sector collimator magnet 80 is positioned to properly receive the scanned beam 90. If secondary coils of the type shown in FIG. 4 are used, the sector collimator magnet should be oriented to an angle θ given by Eq. 10 so that its deflection plane and the plane of the scanned beam are coplanar. Also, as in the previously described embodiments, the beam is transported from source 4 to wafer 35 entirely in a high vacuum maintained inside an envelope 44 by vacuum pumps 46.

Although specific features are shown in some drawings and not others, this is for convenience only as each feature may be combined with any or all other features according to the invention. Other embodiments will occur to those skilled in the art and are within the scope of the claims.

What is claimed is:

1. A magnetic deflection system for scanning an ion beam over a selected surface comprising:
   a magnetic structure having poles with associated scanning coils and respective pole faces that define therebetween a gap through which the ion beam passes;
   a primary current source coupled to said scanning coils adapted to apply to said scanning coils an excitation current to generate a primary magnetic field in said gap that substantially alternates in polarity as a function of time to cause scanning of the ion beam;
   secondary coils disposed adjacent said gap to produce a secondary magnetic field in said gap, said secondary coils being substantially free from inductive coupling with said scanning coils; and
   a secondary current source coupled to said secondary coils adapted to apply to said secondary coils a current that generates the secondary magnetic field in said gap, said primary and secondary magnetic fields in said gap having a sufficient superimposed resultant magnitude to prevent the transverse cross-section of the ion beam from substantially fluctuating in size while the ion beam is being scanned across the selected surface.

2. The magnetic deflection system of claim 1 wherein said secondary current source is a dc current source.

3. The magnetic deflection system of claim 1 wherein said superimposed magnitude of said primary and secondary magnetic fields is greater than about 50 Gauss.

4. The magnetic deflection apparatus of claim 1 wherein said secondary coils are on a plane and the magnitude of said secondary field is 50 Gauss greater than the maximum value of the component of said time-varying primary magnetic field normal to the plane of said secondary coils.

5. The magnetic deflection system of claim 1 wherein said secondary coils are adapted to generate across said gap secondary magnetic fields of substantially opposite polarity.

6. The magnetic deflection system of claim 5 wherein said secondary coils are further adapted to generate across said gap an additional magnetic field, wherein as the ion beam passes through said gap it passes through at least three regions in which the magnetic field in one of said regions is of opposite polarity as the magnetic field in adjacent regions.

7. The magnetic deflection system of claim 6 wherein each of said secondary coils form at least three loops that substantially lie in the same plane, wherein the areas enclosed by said loops is selected so that the net coupling between said secondary coils and said primary magnetic field is substantially zero.

8. The magnetic deflection apparatus of claim 7 wherein said secondary coils form three side-by-side loops, said loops having respective lengths, along the dimension parallel to the ion beam path through said gap, the length of said center loop being substantially equal to the sum of the lengths of the other two loops.

9. The magnetic deflection system of claim 1 wherein said secondary coils lie in a plane that is substantially parallel to the primary magnetic field in said gap.

10. The magnetic deflection system of claim 1 wherein said secondary coils lie in respective planes that are substantially orthogonal to the primary magnetic field in said gap.

11. The magnetic deflection system of claim 9 or 10 wherein said secondary coils are adapted to generate a magnetic field that is orthogonal to the primary magnetic field and has substantially the same magnitude as the primary magnetic field.

12. The magnetic deflection system of claim 9 or 10 wherein said secondary coils form two adjacent loops.

13. The magnetic deflection system of claim 12 wherein the respective areas enclosed by said loops are substantially equal.

14. The magnetic deflection system of claim 9 or 10 further comprising a magnetic field clamp disposed proximal to said gap and adapted to cause the magnitude of said primary magnetic field to substantially vanish in the region of said gap.

15. The magnetic deflection system of claim 1 wherein said secondary coils are arranged in a plane substantially orthogonal to said primary magnetic field in said gap.

16. The magnetic deflection system of claim 1 further comprising at least one sector magnet disposed in the path of the ion beam and adapted to deflect the ion beam in a direction toward the selected surface in a manner enabling separation of neutral particles from the ion beam before the neutral particles impinge upon the selected surface.

17. The magnetic deflection system of claim 1 wherein said scanning and secondary coils are adapted to cause the ion beam to scan across an angular region in a plane orthogonal to the selected surface.

18. The magnetic deflection system of claim 1 wherein said magnetic structure comprises, at least in part, a plurality of laminations of high magnetic permeability material each of which has a thickness in the range between about 0.2 and 1 millimeter, said laminations being separated by relatively thin electrically insulating layers, and said laminations providing a low reluctance magnetically permeable path for said primary magnetic field, the laminations serving to confine induced eddy currents to limited values in local paths in respective laminations, thereby enabling the desired deflection of the ion beam.

19. The magnetic deflection system of claim 1 further comprising a source of an ion beam to introduce said ion beam into the gap defined by said pole faces.

20. The magnetic deflection system of claim 1 wherein said magnetic structure comprises ferrite material.

21. The magnetic deflection apparatus of claim 20 further comprising a liner for shielding said ferrite material from the ion beam.

22. The magnetic deflection apparatus of claim 31 wherein said liner consists of silicon.

23. The magnetic deflection apparatus of claim 1 wherein said ion beam passes through said gap along a first beam path and said time-varying magnetic field deflects the ion beam in a scanning plane, said system further comprising a dc sector magnet positioned to receive the ion beam after said beam passes through said gap, said sector magnet being constructed and arranged to apply to the ion beam a substantially constant magnetic field that deflects said ion beam in said scanning plane so that said beam follows a second beam path that makes an angle with said first beam path that is substantially greater than zero, whereby a substantial proportion of neutral particles that may exist in the ion beam are removed from the beam before the beam irradiates the selected surface.

24. The magnetic deflection system of claim 23 wherein said dc sector magnetic includes contours shaped according to at least fourth-order polynomials.

25. The magnetic deflection system of claim 1 further comprising:
   a collimator magnet having poles with associated collimator coils and respective pole faces that define therebetween a gap through which the ion beam passes; and
   a collimator current source coupled to said collimator coils and adapted to apply to said collimator coils an energizing waveform to generate a collimating oscillatory magnetic field having a magnitude and having a preselected synchronized relationship with said primary magnetic field, said collimating magnetic field causing the ion beam to substantially follow a preselected beam path, irrespective of the angle of incidence of the beam on the selected surface.

26. A magnetic deflection system for scanning an ion beam over a selected surface comprising:
   a magnetic structure having poles with associated scanning coils and respective pole faces that define therebetween at least a pair of gaps through which the ion beam passes;
   a primary current source coupled to said scanning coils adapted to apply to said scanning coils an excitation current to generate respective primary magnetic fields in said pair of gaps that alternate in polarity as a function of time to cause scanning of the ion beam;
   a field clamp disposed in an intermediate region located between said gaps and adapted to cause the magnitude of said primary magnetic fields to substantially vanish in said intermediate region;
   secondary coils disposed adjacent said pair of gaps to produce secondary magnetic fields in said pair of gaps, said secondary coils being substantially free from inductive coupling with said scanning coils; and
   a secondary current source coupled to said secondary coils adapted to apply to said secondary coils currents that generate the respective secondary magnetic fields in said pair of gaps, said respective secondary magnetic fields being substantially of opposite polarity, said primary and secondary magnetic fields in said pair of gaps having a sufficient superimposed resultant magnitude to prevent the transverse cross-section of the ion beam from substantially fluctuating in size while the ion beam is being scanned across the selected surface.

27. The magnetic deflection system of claim 26 wherein said secondary coils lie in a plane that is substantially parallel to said primary magnetic fields.

28. The magnetic deflection system of claim 26 wherein said secondary coils lie in a plane that is substantially orthogonal to said primary magnetic fields.

29. A magnetic deflection system for scanning an ion beam over a selected surface comprising:
   a magnetic structure having poles with associated scanning coils and respective pole faces that define therebetween a gap through which the ion beam passes;
   waveform generating means for energizing said scanning coils to generate a primary magnetic field in said gap to cause scanning of the ion beam; and
   beam controlling means disposed adjacent said gap to produce a magnetic field in said gap that prevents the transverse cross-section of the ion beam at the selected surface from substantially fluctuating in size while the ion beam is scanning over the selected surface, said beam controlling means being substantially free from inductive coupling with said scanning coils.

30. An ion implantation system comprising
   a magnetic deflection system for scanning an ion beam over a selected surface, in combination with
   an ion source for a selected species of ions,
   an end station arranged to position a semiconductor substrate having a selected surface for receiving said ion beam, and
   a vacuum housing extending from said ion source, about said magnetic system to said end station whereby said beam is exposed directly to the pole faces of said deflection system as the beam travels under vacuum from said ion source to said end station,
   said magnetic deflection system being constructed and arranged to scan said beam of heavy ions uniformly across said substrate at said end station to effect ion implantation in said substrate, said magnetic deflection system comprising:
   a magnetic structure having poles with associated scanning coils and respective pole faces that define therebetween a gap through which the ion beam passes, said magnetic structure comprising, at least in part, laminations of high magnetic permeability material each having thickness in the range between about 0.2 and 1 millimeter, said laminations being separated by relatively thin electrically insulating layers, said laminations providing a low reluctance magnetically permeable path for said fundamental frequency and higher order harmonic components of said strong magnetic field, the laminations serving to confine induced eddy currents to limited values in local paths in respective laminations;
   a primary current source coupled to said scanning coils adapted to apply to said scanning coils an excitation current having a fundamental frequency of the order of 20 Hz or greater together with substantially higher order harmonics to generate a primary magnetic field in said gap that alternates in polarity as a function of time to cause scanning of the ion beam;
   secondary coils disposed adjacent said gap to produce a secondary magnetic field in said gap, said secondary coils being substantially free from inductive coupling with said scanning coils; and
   a secondary current source coupled to said secondary coils adapted to apply to said secondary coils a current that generates a secondary magnetic field in said gap, said primary and secondary magnetic fields in said gap having a sufficient superimposed resultant magnitude to prevent the transverse cross-section of the ion beam from substantially fluctuating in size while the ion beam is being scanned across the selected surface.

31. A magnetic deflection system for uniformly scanning an ion beam over a selected surface comprising:

a magnetic structure having poles with respective pole faces that define therebetween a gap through which the ion beam passes, said magnetic structure comprising, at least in part, laminations of high magnetic permeability material each having thickness in the range between about 0.2 and 1 millimeter, said laminations being separated by relatively thin electrically insulating layers, said laminations providing a low reluctance magnetically permeable path for said fundamental frequency and higher order harmonic components of said strong magnetic field, the laminations serving to confine induced eddy currents to limited values in local paths in respective laminations; and a magnetic circuit adapted to apply to said gap, when the ion beam is impinging on the selected surface, a magnetic field that varies as a function of time to cause scanning of the ion beam at a rate of at least 20 Hz, said magnetic field having a magnitude sufficiently greater than zero to prevent the transverse cross-section of the ion beam from substantially fluctuating in size while the ion beam is being uniformly scanned across the selected surface.

32. The magnetic deflection system of claim 31 wherein the magnetic circuit is adapted to maintain in said gap a magnetic field that has a magnitude that is at least 50 Gauss while the ion beam is being scanned across the selected surface.

33. The magnetic deflection apparatus of claim 31 further comprising a velocity separator disposed in the path of the ion beam for removing singly-charged ions from the ion beam before the ion beam irradiates the selected surface so that higher final ion energies can be obtained from the multiply-charged ions remaining in the beam.

34. The magnetic deflection system of claim 31 wherein the magnetic circuit comprises a scanning coil for producing a magnetic field in said gap for uniformly scanning the ion beam across the selected surface and a secondary coil for producing a secondary magnetic field in said gap, said secondary coil being substantially free from inductively coupling with said scanning coil.

35. A method for scanning an ion beam over a selected surface comprising the steps of:

providing a magnetic structure having poles with associated scanning coils and respective pole faces that define therebetween a gap;

passing an ion beam through said gap;

generating an energizing waveform in said scanning coils to generate a primary magnetic field in said gap to cause scanning of said ion beam; and providing a magnetic field generator that is substantially free from inductive coupling with said scanning coils for producing a secondary magnetic field in said gap that magnetically prevents the transverse cross-section of the ion beam at the selected surface from substantially fluctuating in size while the ion beam is scanning over the selected surface.

36. The method of claim 35 further comprising the step of deflecting said ion beam after said beam passes through said gap in a manner that substantially reduces the proportion of neutral particles that may exist in said beam prior to being deflected.

37. The method of claim 35 wherein the magnitude of the secondary magnetic field produced in said gap by said magnetic field generator is at least 50 Gauss while the ion beam is being scanned across the selected surface.

* * * * *

UNITED STATES PATENT AND TRADEMARK OFFICE
CERTIFICATE OF CORRECTION

PATENT NO.   : 5,481,116

DATED        : January 2, 1996

INVENTOR(S)  : Hilton F. Glavish et al.

It is certified that error appears in the above-identified patent and that said Letters Patent is hereby corrected as shown below:

Col. 13, line 66, "My/q" should be --Mv/q--;

Col. 15, line 54, "(My/q)" should be --(Mv/q)--;

Col. 17, line 18, "θ" should be --0--;

Col. 19, claim 22, line 1, "31" should be --21--;

Signed and Sealed this

Fourth Day of February, 1997

Attest:

BRUCE LEHMAN

*Attesting Officer*   *Commissioner of Patents and Trademarks*